(12) United States Patent
Park et al.

(10) Patent No.: US 8,551,684 B2
(45) Date of Patent: Oct. 8, 2013

(54) POLYMER FOR FORMING RESIST PROTECTION FILM, COMPOSITION FOR FORMING RESIST PROTECTION FILM, AND METHOD OF FORMING PATTERNS OF SEMICONDUCTOR DEVICES USING THE COMPOSITION

(75) Inventors: Jong Kyoung Park, Gyeonggi (KR); Man Ho Han, Gyeonggi (KR); Hyun Jin Kim, Gyeonggi (KR); Deog Bae Kim, Gyeonggi (KR)

(73) Assignee: Dongjin Semichem Co., Ltd. (KR)

( * ) Notice: Subject to any disclaimer, the term of this patent is extended or adjusted under 35 U.S.C. 154(b) by 98 days.

(21) Appl. No.: 13/174,204

(22) Filed: Jun. 30, 2011

(65) Prior Publication Data
US 2012/0003589 A1 Jan. 5, 2012

(30) Foreign Application Priority Data

Jun. 30, 2010 (KR) .......................... 10-2010-0062955

(51) Int. Cl.
| G03F 7/11 | (2006.01) |
| G03F 7/20 | (2006.01) |
| G03F 7/30 | (2006.01) |
| G03F 7/36 | (2006.01) |
| G03F 7/38 | (2006.01) |

(52) U.S. Cl.
USPC ................. 430/270.1; 430/273.1; 430/311; 430/313; 430/325; 430/326; 430/330; 430/907; 430/910; 526/242

(58) Field of Classification Search
None
See application file for complete search history.

(56) References Cited

U.S. PATENT DOCUMENTS

| 2003/0078352 A1 | 4/2003 | Miyazawa et al. |
| 2009/0208867 A1 | 8/2009 | Harada et al. |
| 2010/0136486 A1 | 6/2010 | Harada et al. |
| 2011/0151378 A1* | 6/2011 | Matsumura et al. ....... 430/270.1 |

FOREIGN PATENT DOCUMENTS

| EP | 1367440 B1 | 12/2003 |
| JP | 2002220416 A | 8/2002 |
| JP | 2005037777 A | 2/2005 |
| JP | 2009192784 A | 8/2009 |
| KR | 1020060044338 A | 5/2006 |
| WO | 2009057484 A1 | 5/2009 |
| WO | 2009142181 A1 | 11/2009 |
| WO | 2009142183 A1 | 11/2009 |

OTHER PUBLICATIONS

Burnett et al.; "Static and Dynamic Contact Angles of Water on Photoresist" J. Vac. Sci. Techn. B, 23(6), pp. 2721-2727 (1 pages abstract submitted) Nov./Dec. 2005.
English Translation of a Non-Final Rejection Korean Intellectual Property Office Application No. 10-2010-0062955 Dated: Nov. 2, 2012 4 pages.

\* cited by examiner

Primary Examiner — Sin J. Lee
(74) Attorney, Agent, or Firm — St. Onge Steward Johnston & Reens LLC

(57) ABSTRACT

A polymer for forming a resist protection film which is used in a liquid immersion lithography process to protect a photoresist layer, a composition for forming a resist protection film, and a method of forming a pattern of a semiconductor device using the composition are disclosed. The polymer for forming a resist protection film includes a repeating unit represented by Formula 1 below.

Formula 1

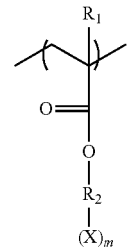

In Formula 1, $R_1$ is a hydrogen atom (H), a fluorine atom (F), a methyl group (—$CH_3$), a C1-C20 fluoroalkyl group, or a C1-C5 hydroxyalkyl group, $R_2$ is a C1-C10 linear or branched alkylene group or alkylidene group, or a C5-C10 cycloalkylene group or cycloalkylidene group, X is

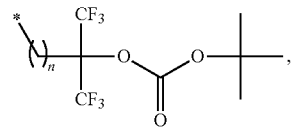

wherein n is an integer of 0 to 5 and \* denotes the remaining moiety of Formula 1 after excluding X, and m, the stoichiometric coefficient of X, is 1 or 2.

12 Claims, No Drawings

POLYMER FOR FORMING RESIST PROTECTION FILM, COMPOSITION FOR FORMING RESIST PROTECTION FILM, AND METHOD OF FORMING PATTERNS OF SEMICONDUCTOR DEVICES USING THE COMPOSITION

CROSS-REFERENCE TO RELATED PATENT APPLICATION

This application claims the benefit of Korean Patent Application No. 10-2010-0062955, filed on Jun. 30, 2010, in the Korean Intellectual Property Office, the disclosure of which is incorporated herein in its entirety by reference.

SUMMARY OF THE INVENTION

The present invention relates to a polymer for forming a resist protection film, and more particularly, to a polymer for forming a resist protection film which is used in a liquid immersion lithography process to protect a photoresist layer. The present invention also relates to a composition for forming a resist protection film, and a method of forming a pattern of a semiconductor device using the composition.

BACKGROUND OF THE INVENTION

Lithography techniques are widely applied to the manufacture of microstructures of a variety of electronic devices such as semiconductor devices and liquid crystal devices. As electronic devices get miniaturized, the need for micropatterning resists increasingly becomes more important in lithography processes. In the fabrication of micropatterns of 90 nm or finer, developing an exposure device and a resist corresponding to it becomes the key issue. Generally, using short-wavelength light sources such as $F_2$ excimer laser, extreme ultraviolet (EUV), electron beam, X-rays, and soft X-rays and increasing the numerical aperture (NA) of lenses are the focuses in the development of exposure devices. However, expensive new exposure devices are required for the shift to short-wavelength light sources. Meanwhile, the increase in the NA causes a trade-off relation between the resolution and the focal-depth range, so that an increase in resolution is accompanied by a reduction in the focal-depth range.

Liquid immersion lithography is a lithographic process capable of solving this problem. In liquid immersion lithography, at least one liquid, such as pure water, a fluorine-based inert liquid, or the like is placed on a resist layer upon a substrate to a predetermined thickness so that a liquid immersion medium (immersion solution, liquid having a refractive index, etc.) can be interposed between a lens and a resist layer during the exposure process. As a result, an inert gas such as air and nitrogen that has been filling the light path during an exposure process is replaced with a liquid immersion medium having a refractive index greater than that of the inert gas, for example, pure water. Through such replacement, a higher resolution is obtained while preventing deterioration in the focal-depth range despite using a light source of the same wavelength for exposure, as in the case of a shorter-wavelength light source or a higher NA lens. Thus, liquid immersion lithography provides an inexpensive technique capable of forming a resist pattern having both a high resolution and a wide focal-depth range with a lens already mounted on a pre-existing device, and hence, much attention has been paid to liquid immersion lithography.

However, because a resist film directly contacts a liquid immersion medium during an exposure process of liquid immersion lithography, invasion by the liquid may occur. In addition, the resist material may leach out to the surroundings due to the liquid immersion medium.

SUMMARY OF THE INVENTION

The present invention provides a polymer for forming a resist protection film including a repeating unit represented by Formula 1 below:

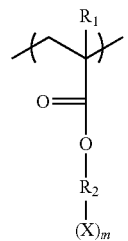

Formula 1 wherein $R_1$ is a hydrogen atom (H), a fluorine atom (F), a methyl group (—$CH_3$), a C1-C20 fluoroalkyl group, or a C1-C5 hydroxyalkyl group, $R_2$ is a C1-C10 linear or branched alkylene group or alkylidene group, or a C5-C10 cycloalkylene group or cycloalkylidene group, X is

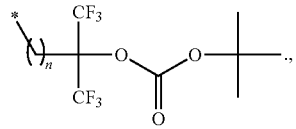

wherein n is an integer of 0 to 5 and * is the moiety of Formula 1 that would remain if X were taken out, and m, which is the stoichiometric coefficient of X, is 1 or 2.

DETAILED DESCRIPTION OF THE INVENTION

Hereinafter, the present invention will be described in more detail.

According to an embodiment of the present invention, there are provided a polymer for forming a resist protection film capable of increasing the receding contact angle of a photoresist layer against a liquid immersion medium such as water (pure water) during a liquid immersion lithography process, a composition for forming a resist protection film which includes the polymer, and a method of forming a pattern of a semiconductor device using the composition.

According to another embodiment of the present invention, there are provided a polymer for forming a resist protection film capable of reducing leaching of the resist material caused by the liquid immersion medium during liquid immersion lithography, a composition for forming a resist protection film which includes the polymer, and a method of forming a pattern of a semiconductor device using the composition.

The polymer for forming a resist protection film is used to form a photoresist protection film (top-coat) that protects a photoresist layer from the liquid immersion medium during a liquid immersion lithography process. The polymer includes a repeating unit represented by Formula 1 below.

Formula 1

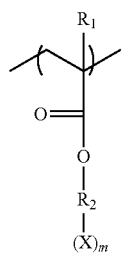

In Formula 1, R1 is a hydrogen atom (H), a fluorine atom (F), a methyl group (—CH$_3$), a C1-C20, for example, C1-C12, preferably C2-C10, fluoroalkyl group, or a C1-05 hydroxyalkyl group, R$_2$ is a C1-C10, for example, C1-C7, preferably C2-C6, linear or branched alkylene group or alkylidene group, or a C5-C10, preferably C6-C7, cycloalkylene group or cycloalkylidene group, X is

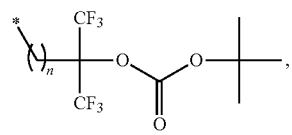

wherein n is an integer of 0 to 5 and * is the moiety of Formula 1 that would remain when X is taken out from Formula 1, and m, the stoichiometric coefficient of X, is 1 or 2. That is, if m=2, two units of X are bonded to R$_2$. In other words, if m=2, the parent alkyl or cycloalkyl group for R$_2$, which in turn, is an alkylene group or alkylidene group, has two of its hydrogen atoms substituted with X's. When it is stated herein that R$_2$ is an alkylene group, it is meant to encompass not only the structure in which the —C(=O)—O— of Formula 1 is bonded to one carbon atom of R$_2$ and one X is bonded to another carbon atom of R$_2$, but also the structure in which —C(=O)—O— is bonded to one carbon atom, one X is bonded to another carbon atom, and the other X is bonded to still another carbon atom. When it is stated herein that R$_2$ is an alkylidene group, it is meant to encompass, but not restricted to the structure in which two X's are bonded to the same carbon atom of R$_2$, and the structure in which one X and —C(=O)—O— of Formula 1 are bonded to the same carbon atom of R$_2$. The amount of the repeating unit of Formula 1 may be in the range of 1 to 100% by weight, preferably 1 to 90% by weight, more preferably 5 to 50% by weight, for example, 10 to 40% by weight, based on the weight of the total repeating units contained in the polymer for forming a resist protection film, and the remaining repeating units may be any repeating unit commonly used in this field for polymers for the same purpose. If the amount of the repeating unit of Formula 1 is less than 1% by weight, the receding contact angle of a photoresist layer against the liquid immersion medium such as water may be reduced or the resist material may leach out to the surroundings.

Examples of the repeating unit represented by Formula 1 may include repeating units represented by Formulae 1a to 1o below.

Formula 1a

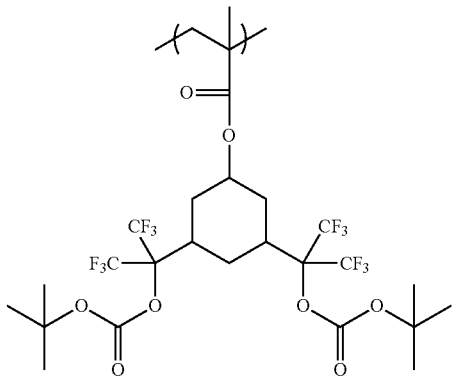

Formula 1b

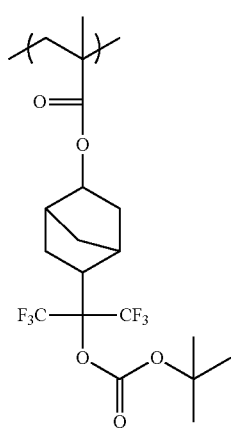

Formula 1c

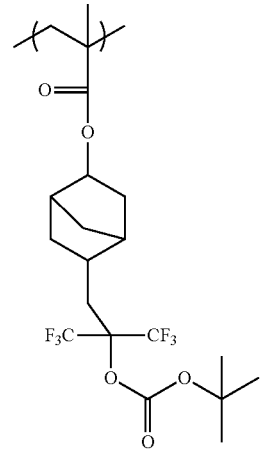

Formula 1d

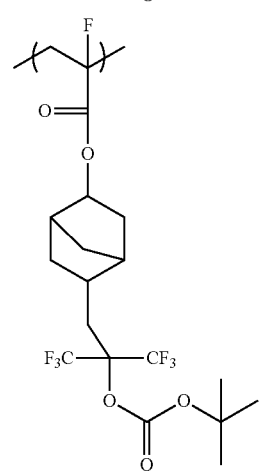

Formula 1e
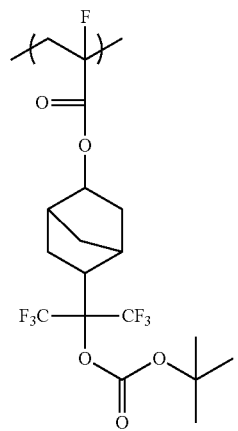
Formula 1f
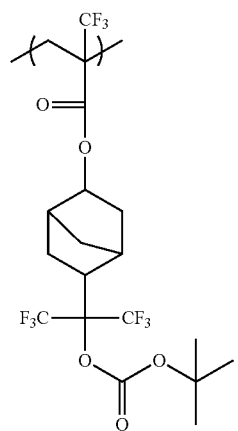
Formula 1g
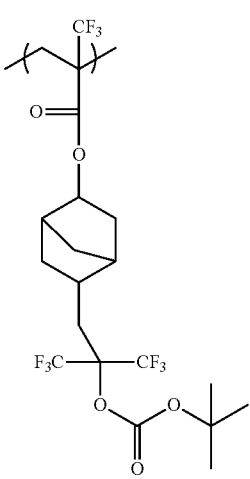
Formula 1h
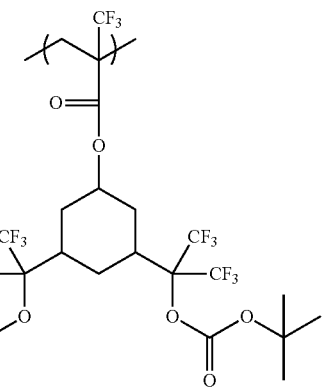
Formula 1i
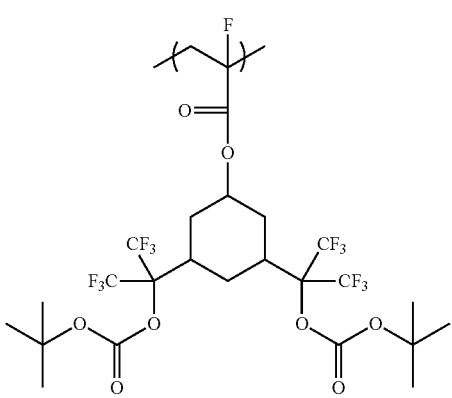
Formula 1j
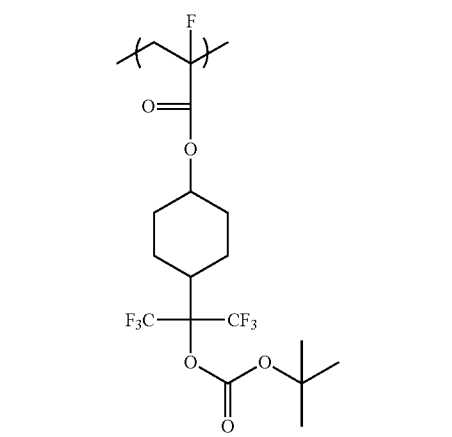
Formula 1k
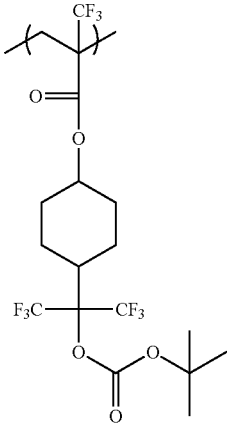

Formula 1l

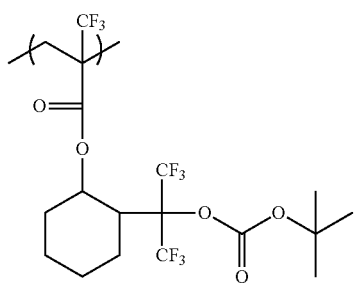

Formula 1m

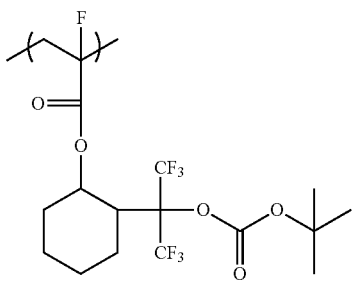

Formula 1n

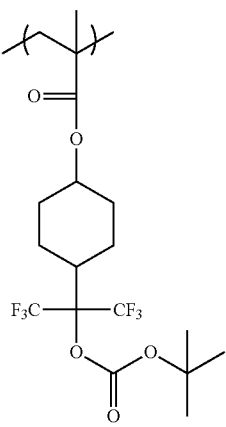

Formula 1o

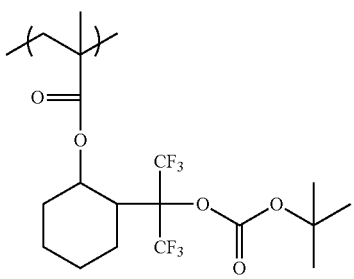

The monomer of the repeating unit represented by Formula 1

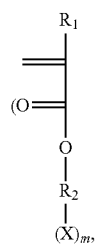

wherein $R_1$, $R_2$, X, and m are as defined above with respect to Formula 1) may be obtained by a reaction between the hydroxyl group (—OH) of a hexafluoroalcohol group of a monomer containing the hexafluoroalcohol group, and di-tert-butyl dicarbonate. For example, a monomer comprising that repeating unit represented by Formula 1a above can be obtained from the reaction between di-tert-butyl dicarbonate and MA-3,5-bis(hexafluoro-2-hydroxy-2-propyl)cyclohexyl methacrylate, a monomer including a hexafluoroalcohol group using 4-dimethylaminopyridine (DMAP) as a catalyst and tetrahydrofuran (THF) as a solvent as shown in Reaction Scheme 1 below.

Reaction Scheme 1

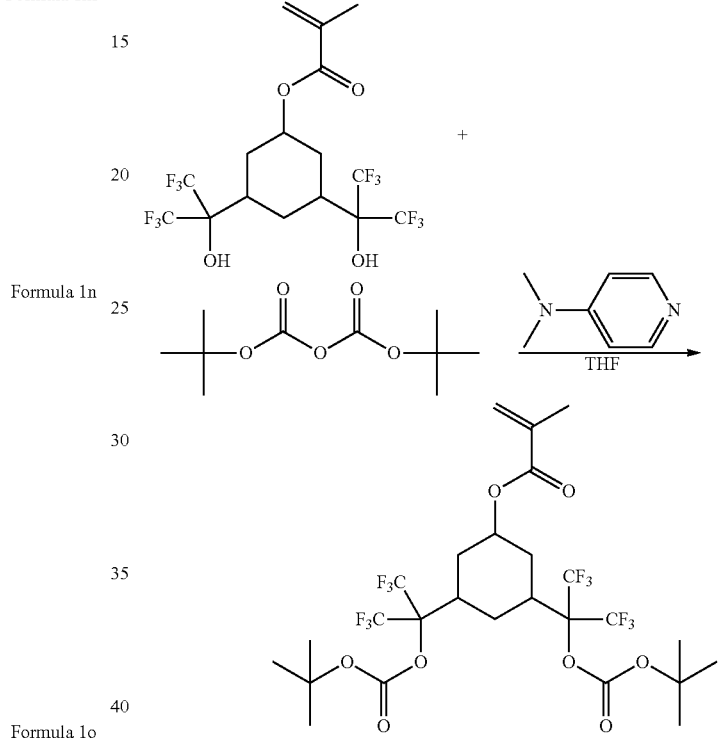

Examples of the inventive polymer for forming a resist protection film include homopolymers of the repeating unit represented by Formula 1, compounds represented by Formula 2 below, compounds represented by Formula 3 below, and a compound represented by Formula 4 below. That is, the inventive polymer for forming a resist protection film may include: a repeating unit including $R_3$ as shown in Formula 2 below; a repeating unit including $R_3$ and a repeating unit including $R_4$ as shown in Formula 3 below; and a repeating unit including $R_4$ and a repeating unit including a sulfonyl group as shown in Formula 4 below.

Formula 2

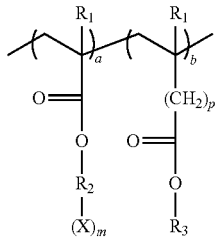

In Formula 2, $R_1$, $R_2$, X and m are as defined above with respect to Formula 1, $R_3$ is a hydrogen atom, or a C1-C25, for example, C2-C18, linear or branched alkyl group including at least one hydroxyl group (—OH) or carboxyl group (—COOH) or a C5-C25, for example, C6-C18, cycloalkyl group, p is an integer of 0 to 3, and a and b are the coefficients of their corresponding repeating units, wherein the amount of the repeating unit denoted by the coefficient a is in the range of 1 to 99% by weight based on the weight of the polymer, and the amount of the repeating unit denoted by the coefficient b is in the range of 1 to 99% by weight based on the weight of the polymer. Preferably, the amounts of the repeating units denoted by the coefficients a and b are in the range of 10 to 90% by weight, respectively. The copolymer of Formula 2 is not limited to block copolymers or alternating copolymers in which the two repeating units are linked to each other in the order shown in Formula 2. Any copolymer including the two repeating units in the amounts defined above and having these units in every possible order and linkage can be used.

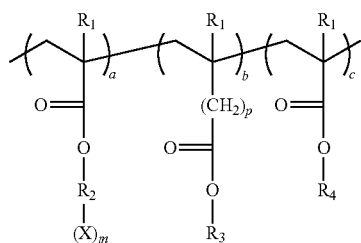

Formula 3

In Formula 3, $R_1$, $R_2$, $R_3$, X, p, and m are as defined above with respect to Formulae 1 and 2, $R_4$ is a C1-C25, for example, C2-C18, a linear or branched alkyl group or a C5-C25, for example, C6-C18, a cycloalkyl group, unsubstituted or substituted with at least one fluorine atom, and a, b, and c are the coefficients of their corresponding repeating units, wherein the amount of the repeating unit denoted by the coefficient a is in the range of 1 to 98% by weight based on the weight of the polymer, the amount of the repeating unit denoted by the coefficient b is in the range of 1 to 98% by weight based on the weight of the polymer, and the amount of the repeating unit denoted by the coefficient c is in the range of 1 to 98% by weight based on the weight of the polymer. Preferably, the amounts of the repeating units denoted by the coefficients a, b, and c are in the range of 5 to 90% by weight, respectively. The copolymer of Formula 3 is not limited to block copolymers or alternating copolymers in which the three repeating units are linked to one another in the order shown in Formula 3. Any copolymer comprising the three repeating units in the amounts defined above and having these units in every possible order and linkage can be used.

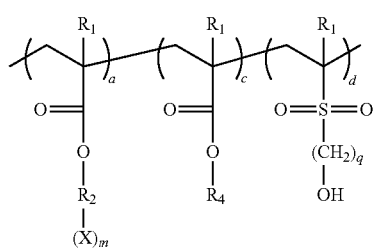

Formula 4

In Formula 4, $R_1$, $R_2$, $R_4$, X, and m are as defined above with respect to Formulae 1 and 3, q is an integer of 0 to 3, and a, c, and d are the coefficients of their corresponding repeating units, wherein the amount of the repeating unit denoted by the coefficient a is in the range of 1 to 98% by weight based on the weight of the polymer, the amount of the repeating unit denoted by the coefficient c is in the range of 1 to 98% by weight based on the weight of the polymer, and the amount of the repeating unit denoted by the coefficient d is in the range of 1 to 98% by weight based on the weight of the polymer. Preferably, the amounts of the repeating units denoted by the coefficients a, c, and d are in the range of 5 to 90% by weight, respectively. The copolymer of Formula 4 is not limited to block copolymers or alternating copolymers in which the three repeating units are linked to one another in the order shown in Formula 4. Any copolymer including the three repeating units in the amounts defined above and having these units in every possible order and linkage can be used.

The repeating unit including $R_3$, the repeating unit including $R_4$, and the repeating unit including a sulfonyl group are those used to build commonly used polymers for forming resist protection films, wherein the illustrative examples of the repeating unit including $R_3$ include

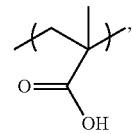
(Formula 2a)

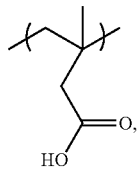
(Formula 2b)

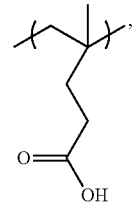
(Formula 2c)

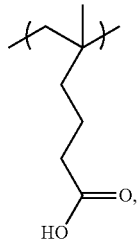
(Formula 2d)

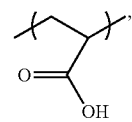
(Formula 2e)

(Formula 2f)
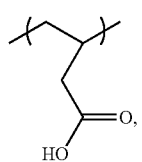
(Formula 2g)
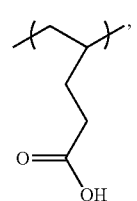
(Formula 2h)
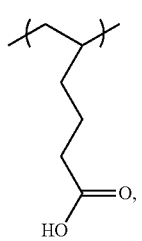
(Formula 2i)
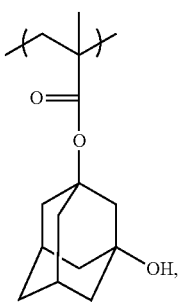
(Formula 2j)
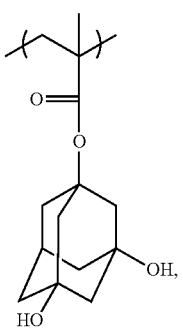
(Formula 2k)
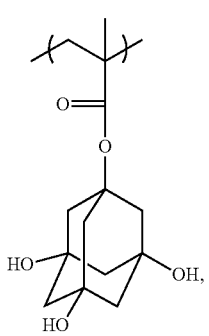
(Formula 2l)
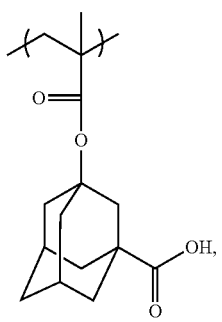
, and
(Formula 2m)
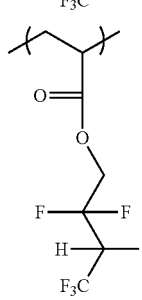
and the illustrative examples of the repeating unit including $R_4$ include
(Formula 3a)
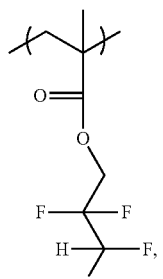
(Formula 3b)
(Formula 3c)
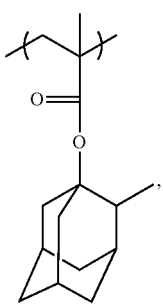

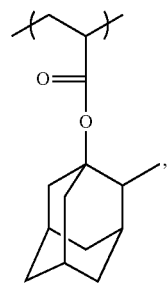 (Formula 3d)
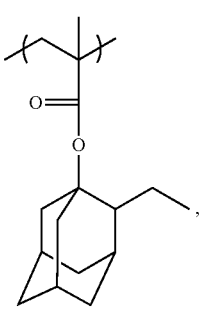 (Formula 3e)
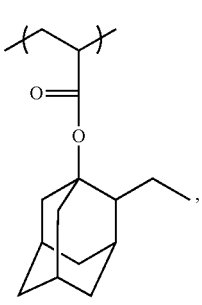 (Formula 3f)
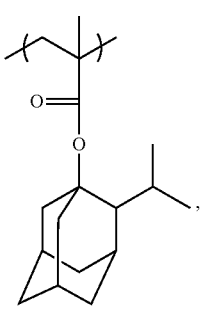 (Formula 3g)
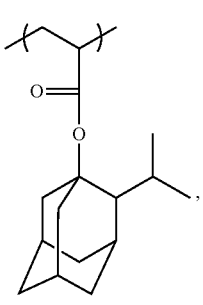 (Formula 3h)
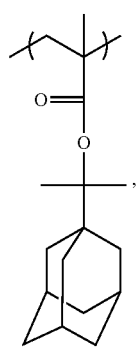 (Formula 3i)
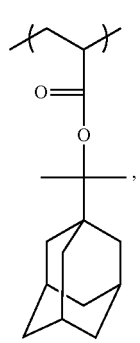 (Formula 3j)
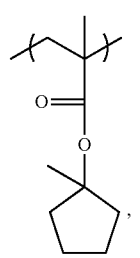 (Formula 3k)
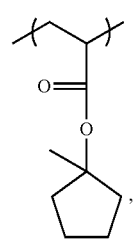 (Formula 3l)
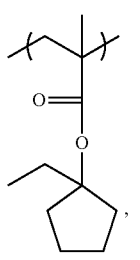 (Formula 3m)

-continued (Formula 3n)
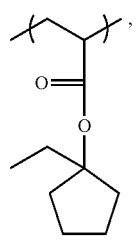

(Formula 3o)
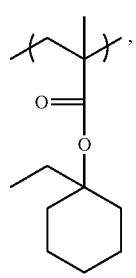

(Formula 3p)
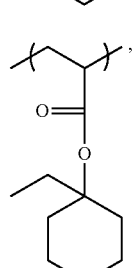

(Formula 3q)
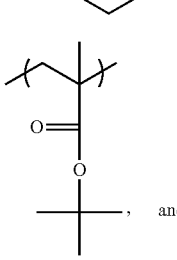

and (Formula 3r)
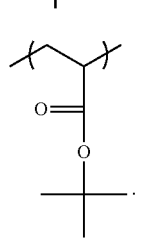

The inventive polymer for forming a resist protection film may be prepared by using a monomer of the repeating unit represented by Formula 1 (

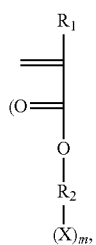

wherein $R_1$, $R_2$, X, and m are as defined above with respect to Formula 1) alone, or by co-polymerizing said monomer with such co-monomer(s) as a monomer of the repeating unit represented by Formula 1, a monomer of the repeating unit including $R_3$ (

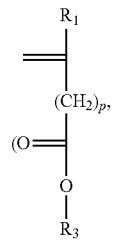

wherein $R_1$, $R_3$, and p are as defined above with respect to Formula 2), the monomer of the repeating unit including $R_4$ (

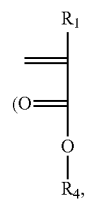

wherein $R_1$ and $R_4$ are as defined above with respect to Formula 3), and/or a monomer of the repeating unit including the sulfonyl group (

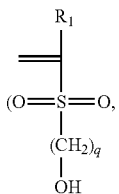

wherein $R_1$ and q are as defined above with respect to Formula 4) using conventional methods commonly known in the art, for example, in the presence of an art-known polymerization initiator such as azobis(isobutyronitrile) (AIBN) and an art-known solvent such as THF.

The polymer for forming a resist protection film according to the present invention may be a blend of a homopolymer described above, a compound represented by Formula 2, a compound represented by Formula 3, and/or a compound represented by Formula 4 with a polymer conventionally used for forming resist protection films, for example, a compound represented by Formula 5 below.

Formula 5
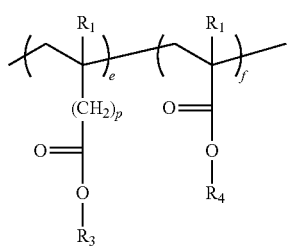

In Formula 5, $R_1$, $R_3$, $R_4$ and p are as defined above with respect to Formulae 1 to 3, e and f are the coefficients of their respective repeating units, wherein the amount of the repeating unit denoted by the coefficient e is in the range of 1 to 99% by weight based on the weight of the polymer and the amount of the repeating unit denoted by the coefficient f is in the range of 1 to 99% by weight based on the weight of the polymer. Preferably, the amounts of the repeating units denoted by the coefficients e and f are in the range of 5 to 95% by weight, respectively. The copolymer of Formula 5 is not limited to block copolymers or alternating copolymers in which the two repeating units are linked to each other in the order shown in Formula 5. Any copolymer comprising the two repeating units in the amounts defined above and having these units in every possible order and linkage can be used.

In the blends of a homopolymer described above, a compound represented by Formula 2, a compound represented by Formula 3, and/or a compound represented by Formula 4 with the compound represented by Formula 5, the combined amount of the homopolymer, the compound represented by Formula 2, the compound represented by Formula 3, and/or the compound represented by Formula 4 is in the range of 1 to 99% by weight, preferably 5 to 95% by weight, and the amount of the compound represented by Formula 5 is in the range of 1 to 99% by weight, preferably 5 to 95% by weight. If the combined amount of the homopolymer, the compound represented by Formula 2, the compound represented by Formula 3, and/or the compound represented by Formula 4 falls down to less than 1% by weight (i.e., if the amount of the compound represented by Formula 5 is greater than 99% by weight), the receding contact angle of a photoresist layer against the liquid immersion medium such as water may be reduced. If the combined amount is greater than 99% by weight (i.e., if the amount of the compound represented by Formula 5 is less than 1% by weight), the photoresist pattern may be rendered undevelopable a 2.38 wt % aqueous tetramethylammonium hydroxide (TMAH) solution (developing solution).

The weight average molecular weight of the polymer for forming a resist protection film is in the range of 1,000 to 100,000, preferably 3,000 to 30,000. If the weight average molecular weight of the polymer for forming a resist protection film is less than 1,000, the resist protection film may not form. On the other hand, if the weight average molecular weight of the polymer for forming a resist protection film is greater than 100,000, the polymer may not dissolve in a solvent.

The polymer of the present invention for forming a resist protection film serves to form protection films on photoresist layers capable of widening the receding contact angle of the photoresist layer against the liquid immersion medium such as water during liquid immersion lithography processes. The inventive polymer can also reduce leaching of the resist material caused by the immersion solution (liquid immersion medium).

In another aspect of the present invention, a composition for forming a resist protection film is provided. The composition of the present invention includes the above-mentioned polymer for forming a resist protection film and a solvent. In the composition for forming a resist protection film, the amount of the polymer for forming a resist protection film is in the range of 1 to 30% by weight, preferably 1 to 25% by weight, more preferably 5 to 20% by weight. If the amount of the polymer for forming a resist protection film is less than 1% by weight, the resist protection film may not form. On the other hand, if the amount of the polymer for forming a resist protection film is greater than 30% by weight, the resist protection film may turn out too thick for developing the photoresist pattern.

In the composition for forming a resist protection film, the solvent may be any solvent that is commonly used in the art in making compositions for forming resist protection film. Examples of the solvent include methanol, ethanol, 1-butanol, 1-propanol, 2-propanol, 2-butanol, 1,2-butanediol, 1,2-propanediol, 2-hexanol, 3-hexanol, 2-methyl-1-pentanol, 2-methyl-2-pentanol, 4-methyl-2-pentanol, 5-methyl-2-hexanol, water; cycloethers such as dioxane; diisoheptyl ether, diisoamyl ether; alkyl ethers of polyhydric alcohol such as ethylene glycol monoethyl ether, ethylene glycol monomethyl ether, and diethylene glycol diethyl ether; and any mixture thereof. The content of the solvent is in the range of 70 to 99% by weight, preferably 75 to 99% by weight, more preferably 80 to 95% by weight. If the content of the solvent is less than 70% by weight, uniformity of the resist protection film can be compromised. On the other hand, if the content of the solvent is greater than 99% by weight, the resist protection film may not form at all.

In still another aspect of the present invention, a method of forming a pattern of a semiconductor device using the inventive composition for forming a resist protection film is disclosed. The inventive method may include a liquid immersion lithography process that is commonly used in the art. For example, the method may include (i) coating, for example, spin-coating a composition for forming a resist protection film on a photoresist layer formed on top of the layer to be etched (substrate) to a thickness of, for example, 10 to 100 nm, (ii) forming a resist protection film by baking the (spin-) coated composition for forming a resist protection film, for example, at a temperature in the range of 80 to 100° C. for 60 to 100 seconds, (iii) exposing the photoresist layer by liquid immersion on which the resist protection'film is formed, for example, using a 193 nm ArF liquid immersion-exposure device (ASML 1900i), and post-baking the exposed photoresist layer, for example, at a temperature in the range of 80 to 100° C. for 60 to 100 seconds, (iv) forming a photoresist pattern by developing the post-baked photoresist layer using a developing solution (e.g., 2.38 wt %, tetramethylammonium hydroxide (TMAH) aqueous solution), and (V) forming a pattern by etching the layer to be etched using the photoresist pattern as an etch mask.

The present invention will be described in further detail with reference to the following examples. However, these examples are not intended to limit the purpose and scope of the one or more embodiments of the present invention.

PREPARATION EXAMPLE 1

Preparation of the Monomer of the Repeating Unit Represented by Formula 1a

As shown in Reaction Scheme 1 below, 100 g (0.2 mol) of a monomer including a hexafluoroalcohol group below (MA-3,5-bis(hexafluoro-2-hydroxy-2-propyl)cyclohexyl methacrylate), 94.06 g (0.422 mol) of di-tert-butyl dicarbonate, 4.79 g (0.038 mol) of 4-dimethylaminopyridine (DMAP), and 600 mL of tetrahydrofuran (THF) were added to a 500 mL 2-neck flask equipped with a magnetic stir bar, and the flask was maintained at room temperature for 20 hours. After the reaction was terminated, the THF was removed under a reduced pressure to obtain 134.6 g of the monomer of a repeating unit represented by Formula 1a below {Yield: 96%, NMR: $CH_3$(1.93, 1.4), $CH_2$(1.64, 1.36), CH(3.91, 2.01), H(6.15, 5.58)}.

Reaction Scheme 1

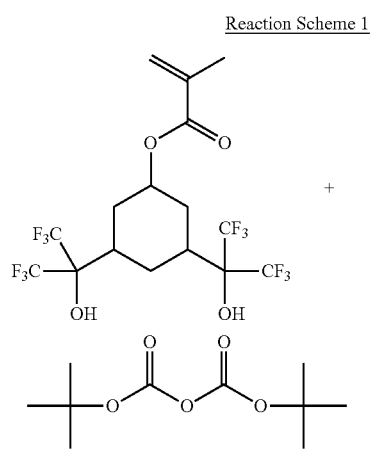

PREPARATION EXAMPLE 2

Preparation of the Monomer of the Repeating Unit Represented by Formula 1b

As shown in Reaction Scheme 2 below, 60 g (0.167 mol) of a monomer including a hexafluoroalcohol group below (1,1,1,3,3,3-hexafluoro-2-(5-methyl-1-methylene)propanol), 78.57 g (0.353 mol) of di-tert-butyl dicarbonate, 4 g (0.032 mol) of DMAP, and 428 g of THF were added to a 500 mL 2-neck flask equipped with a magnetic stir bar, and the flask was maintained at room temperature for 20 hours. After the reaction was terminated, the THF was removed under a reduced pressure to obtain 107 g of a monomer of a repeating unit represented by Formula 1b below {Yield: 91.5%, NMR: $CH_3$(1.24, 1.4), $CH_2$(1.64, 1.36), CH(3.90, 2.03, 1.43)}.

Reaction Scheme 2

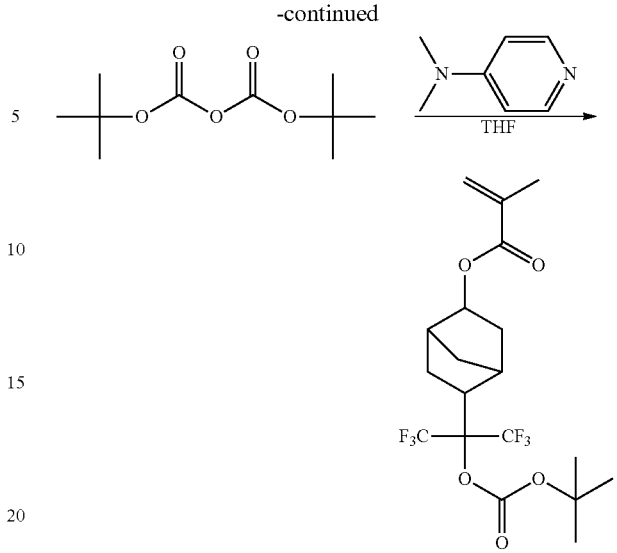

PREPARATION EXAMPLE 3

Preparation of the Monomer of the Repeating Unit Represented by Formula 1d

As shown in Reaction Scheme 3 below, 60 g (0.157 mol) of a monomer including a hexafluoroalcohol group below (t-boc-1,1,1,3,3,3-hexafluoro-norbornane-mathacrylate), 73.85 g (0.332 mol) of di-tert-butyl dicarbonate, 3.76 g (0.03 mol) of DMAP, and 414 g of THF were added to a 500 mL 2-neck flask equipped with a magnetic stir bar, and the flask was maintained at room temperature for 20 hours. After the reaction was terminated, the THF was removed under a reduced pressure to obtain 103 g of the monomer of a repeating unit represented by Formula 1d below {Yield: 93.7%, NMR: $CH_3$(1.24, 1.4), $CH_2$(1.64, 1.43, 1.36), CH(3.91, 2.03, 1.42), H(6.15, 5.58)}.

Reaction Scheme 3

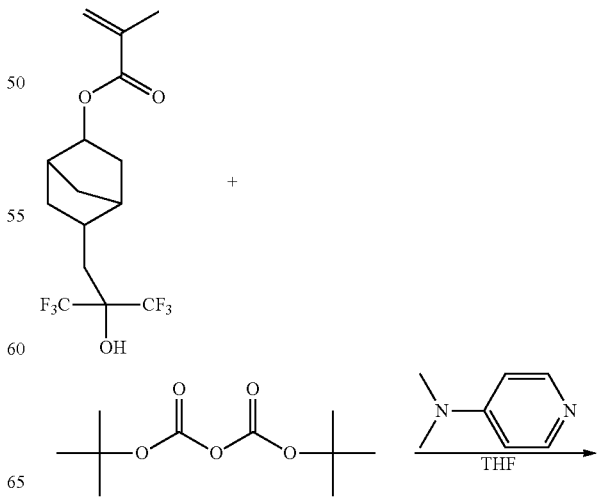

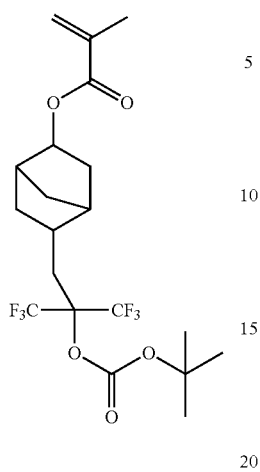
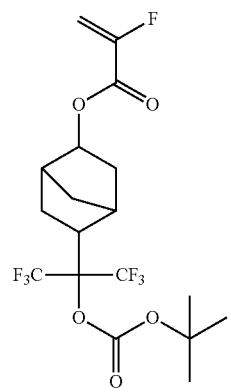

PREPARATION EXAMPLE 4

Preparation of the Monomer of the Repeating Unit Represented by Formula 1e

As shown in Reaction Scheme 4 below, 55 g (0.158 mol) of a monomer including a hexafluoroalcohol group below (t-boc-1,1,1,3,3,3-hexafluoro-norbornane-2-fluoroacrylate), 74.31 g (0.334 mol) of di-tert-butyl dicarbonate, 3.78 g (0.03 mol) of DMAP, and 400 g of THF were added to a 500 mL 2-neck flask equipped with a magnetic stir bar, and the flask was maintained at room temperature for 20 hours. After the reaction was terminated, the THF was removed under a reduced pressure to obtain 98 g of the monomer of a repeating unit represented by Formula 1e below {Yield: 88.6%, NMR: $CH_3$(1.4), $CH_2$(1.73, 1.46, 1.36), CH(3.43, 2.01, 1.43), H(4.14, 3.95)}.

PREPARATION EXAMPLE 5

Preparation of the Monomer of the Repeating Unit Represented by Formula 1i

As shown in Reaction Scheme 5 below, 55 g (0.17 mol) of a monomer including a hexafluoroalcohol group below (3,5-bis(hexafluoro-2-hydroxy-2-propyl)cyclohexyl-2-fluoro-acrylate), 72 g (0.32 mol) of di-tert-butyl dicarbonate, 3.5 g (0.036 mol) of DMAP, and 450 g of THF were added to a 500 mL 2-neck flask equipped with a magnetic stir bar, and the flask was maintained at room temperature for 20 hours. After the reaction was terminated, the THF was removed under a reduced pressure to obtain 103 g of the monomer of a repeating unit represented by Formula 1i below {Yield: 89%, NMR: $CH_3$(1.4), $CH_2$(1.64, 1.40, 1.36), CH(3.9, 2.01, 1.43), H(5.4, 5.41)}.

Reaction Scheme 4

Reaction Scheme 5

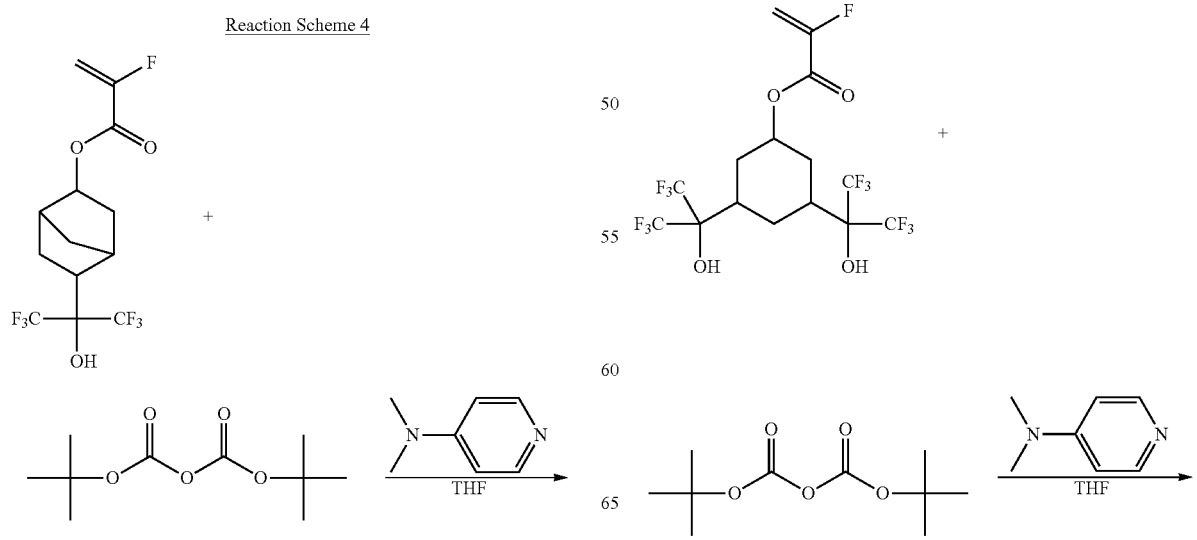

-continued

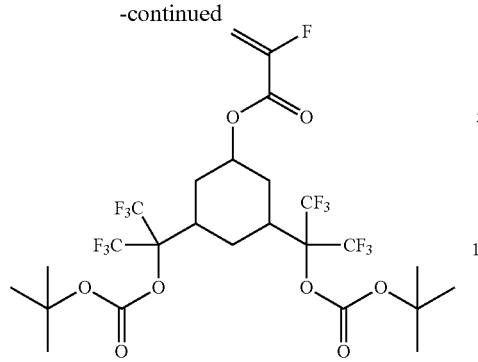

EXAMPLE 1

Preparation of a Polymer for Forming Resist Protection Film Represented by Formula 6a 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator, azobis(isobutyronitrile) (AIBN) were added to a 1000 mL round-bottom flask, and dissolved in a THF solvent. After the reactants were dissolved, the flask was maintained at 70° C. for 12 hours. After the reaction was terminated, the reaction product was precipitated in 4000 mL of hexane, and the precipitate was dried in a vacuum oven at 40° C. for 12 hours. Then, the precipitate was dissolved in ether and re-precipitated in 1000 mL of hexane. The precipitated polymer was collected and dried in a vacuum oven at 40° C. overnight to obtain 51 g of a polymer for forming a resist protection film represented by Formula 6a below (the amount of the repeating unit: mol %, Yield: 50%, weight average molecular weight (Mw): 8200, polydispersity index (PDI): 2.04).

Formula 6a

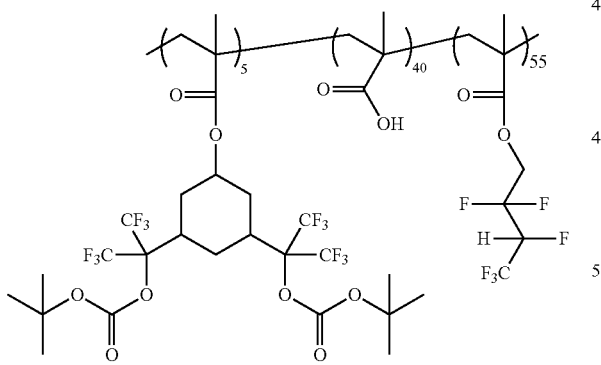

EXAMPLE 2

Preparation of a Polymer for Forming Resist Protection Film Represented by Formula 6b 53 g of a polymer for forming a resist protection film represented by Formula 6b below was prepared in the same manner as in Example 1, except that 35.03 g (0.05 mol) of the monomer of the repeating unit represented by Formula 1a, 15.22 g (0.2 mol) of the monomer of the repeating unit represented by Formula 2a, 62.54 g (0.25 mol) of the monomer of the repeating unit represented by Formula 3a, and 17 g of the polymerization initiator, azobis(isobutyronitrile (AIBN) were used instead of using 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator AIBN (the amount of the repeating unit: mol %, Yield: 47%, weight average molecular weight (Mw): 7600, PDI: 2.42).

Formula 6b

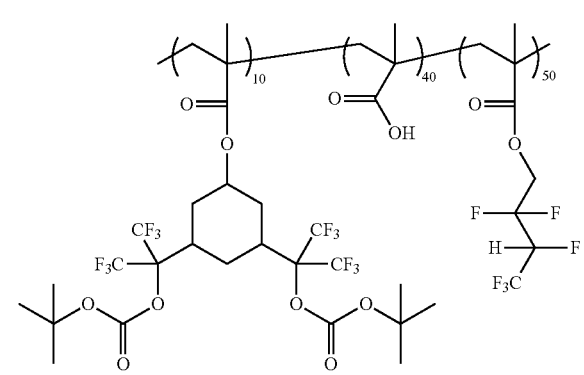

EXAMPLE 3

Preparation of a Polymer for Forming Resist Protection Film Represented by Formula 6c 54 g of a polymer for forming a resist protection film represented by Formula 6c below was prepared in the same manner as in Example 1, except that 52.54 g (0.075 mol) of the monomer of the repeating unit represented by Formula 1a, 15.22 g (0.2 mol) of the monomer of the repeating unit represented by Formula 2a, 56.28 g (0.225 mol) of the monomer of the repeating unit represented by Formula 3a, and 18 g of the polymerization initiator, AIBN were used instead of using 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 43%, weight average molecular weight (Mw): 7524, PDI: 2.27).

Formula 6c

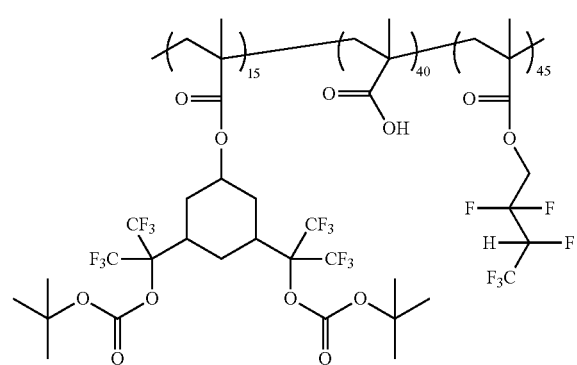

EXAMPLE 4

Preparation of a Polymer for Forming Resist Protection Film Represented by Formula 6d 35 g of a polymer for forming a resist protection film represented by Formula 6d below was prepared in the same manner as in Example 1, except that 17.51 g (0.025 mol) of the monomer of the repeating unit represented by Formula 1a, 17.6 g (0.2 mol) of the monomer of the repeating unit represented by Formula 2b, 53.55 g (0.225 mol) of the monomer of the repeating unit represented by Formula 3b, and 13 g of the polymerization initiator, AIBN were used instead of using 17.51 g (0.025 mol) of the monomer of the repeating unit represented by Formula 1a, 15.02 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 39%, weight average molecular weight (Mw): 6542, PDI: 2.30).

Formula 6d

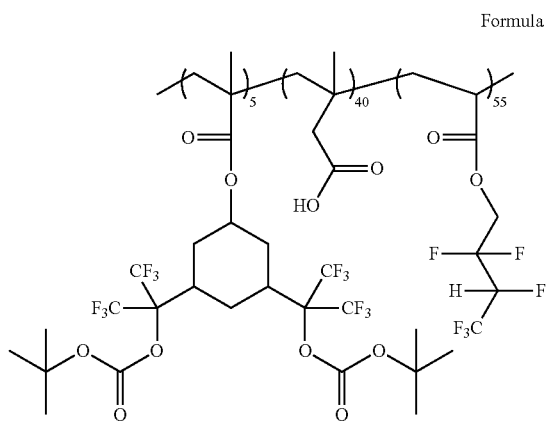

EXAMPLE 5

Preparation of a Polymer for Forming Resist Protection Film Represented by Formula 6e 46 g of a polymer for forming a resist protection film represented by Formula 6e below was prepared in the same manner as in Example 1, except that 11.56 g (0.025 mol) of the monomer of the repeating unit represented by Formula 1b, 25.24 g (0.175 mol) of the monomer of the repeating unit represented by Formula 2d, 51.08 g (0.3 mol) of the monomer of the repeating unit represented by Formula 3l, and 13 g of the polymerization initiator, AIBN were used instead of using 17.51 g (0.025 mol) of the monomer of the repeating unit represented by Formula 1a, 15.02 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 52%, weight average molecular weight (Mw): 6485, PDI: 2.68).

Formula 6e

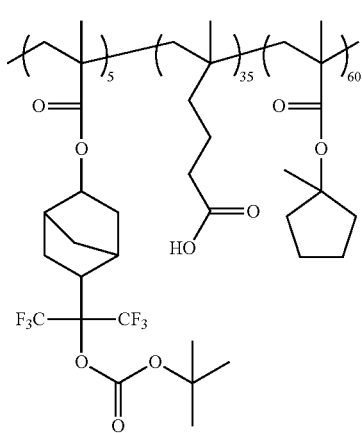

EXAMPLE 6

Preparation of a Polymer for Forming Resist Protection Film Represented by Formula 6f 93 g of a polymer for forming a resist protection film represented by Formula 6f below was prepared in the same manner as in Example 1, except that 16.32 g (0.035 mol) of the monomer of the repeating unit represented by Formula 1e, 78.02 g (0.265 mol) of the monomer of the repeating unit represented by Formula 2l, 53.04 g (0.2 mol) of the monomer of the repeating unit represented by Formula 3e, and 18 g of the polymerization initiator, AIBN were used instead of using 17.51 g (0.025 mol) of the monomer of the repeating unit represented by Formula 1a, 15.02 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 62%, weight average molecular weight (Mw): 4998, PDI: 2.63).

Formula 6f

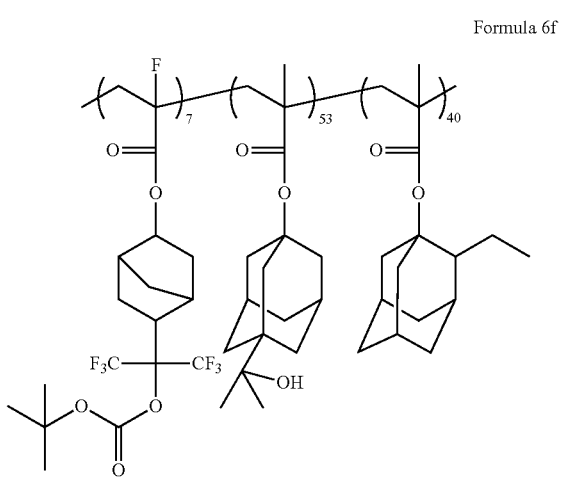

EXAMPLE 7

Preparation of a Polymer for Forming Resist Protection Film Represented by Formula 6q 75 g of a polymer for forming a resist protection film represented by Formula 6 g below was prepared in the same manner as in Example 1, except that 23.32 g (0.05 mol) of the monomer of the repeating unit represented by Formula 1e, 56.07 g (0.2 mol) of the monomer of the repeating unit represented by Formula 2m, 39.56 g (0.25 mol) of the monomer of the repeating unit represented by Formula 3q, and 17 g of the polymerization initiator, AIBN were used instead of using 17.51 g (0.025 mol) of the monomer of the repeating unit represented by Formula 1a, 15.02 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 63%, weight average molecular weight (Mw): 5784, PDI: 2.12).

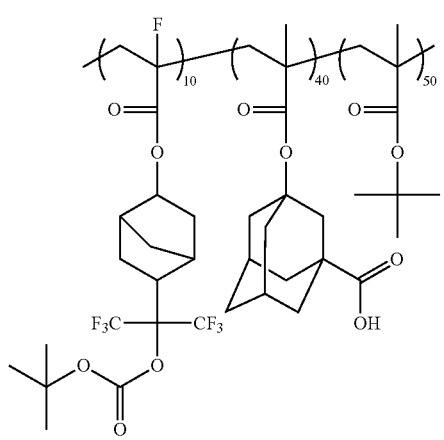

Formula 6g

EXAMPLE 8

Preparation of a Polymer for Forming Resist Protection Film Represented by Formula 6h 92 g of a polymer for forming a resist protection film represented by Formula 6h below was prepared in the same manner as in Example 1, except that 89.57 g (0.125 mol) of the monomer of the repeating unit represented by Formula 1a, 32.28 g (0.375 mol) of the monomer of the repeating unit represented by Formula 2a, and 18 g of the polymerization initiator, AIBN were used instead of using 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 75%, weight average molecular weight (Mw): 7514, PDI: 2.45).

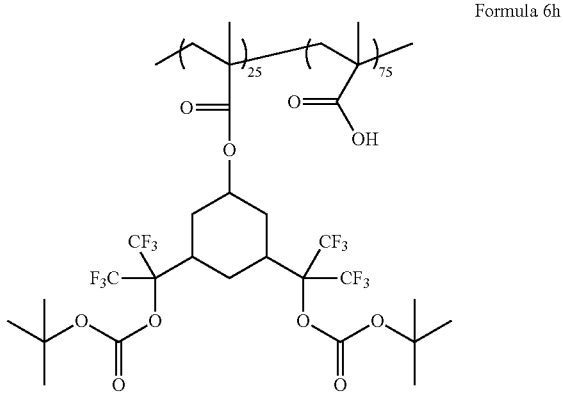

Formula 6h

EXAMPLE 9

Preparation of a Polymer for Forming Resist Protection Film Represented by Formula 6i 130 g of a polymer for forming a resist protection film represented by Formula 6l below was prepared in the same manner as in Example 1, except that 96.08 g (0.2 mol) of the monomer of the repeating unit represented by Formula 1d, 88.33 g (0.3 mol) of the monomer of the repeating unit represented by Formula 2l, and 28 g of the polymerization initiator, AIBN were used instead of using 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 70%, weight average molecular weight (Mw): 7112, PDI: 2.78).

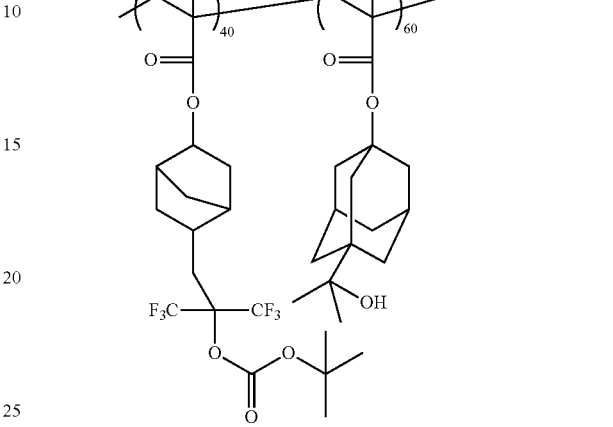

Formula 6i

EXAMPLE 10

Preparation of a Polymer for Forming Resist Protection Film Represented by Formula 6j 135 g of a polymer for forming a resist protection film represented by Formula 6j below was prepared in the same manner as in Example 1, except that 180 g (0.25 mol) of the monomer of the repeating unit represented by Formula 1i, 19.04 g (0.25 mol) of the monomer of the repeating unit represented by Formula 2 g, and 30 g of the polymerization initiator, AIBN were used instead of using 17.51 g (0.025 mol) of the monomer of the repeating unit represented by Formula 1a, 15.2 g (0.2 mol) of the monomer of the repeating unit represented by Formula 2a, 68.79 g (0.275 mol) of the monomer of the repeating unit represented by Formula 3a, and 15 g of the polymerization initiator, AIBN (the amount of the repeating unit: mol %, Yield: 68%, weight average molecular weight (Mw): 8012, PDI: 2.01).

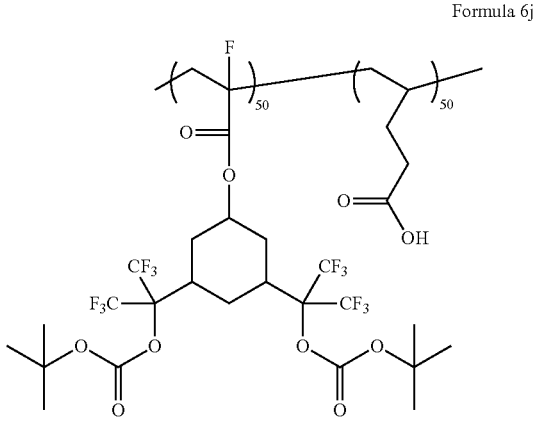

Formula 6j

COMPARATIVE EXAMPLE 1

Preparation of a Polymer for Forming Resist Protection Film Represented by Formula 7a 43 g (0.5 mol) of the monomer of the repeating unit represented by Formula 2a, 125 g (0.5 mol) of the monomer of the repeating unit represented by Formula 3a, and 25.2 g of the polymerization initiator, AIBN were added to a 1000 mL round-bottom flask and dissolved in a THF solvent. After the reactants were dissolved, the flask was maintained at 70° C. for 12 hours. After the reaction was terminated, the reaction product was precipitated in 4000 mL of hexane, and the precipitate was dried in a vacuum oven at 40° C. for 12 hours. Then, the precipitate was dissolved in ether and re-precipitated in 1000 mL of hexane. The precipitated polymer was collected and dried in a vacuum oven at 40° C. overnight to obtain 105 g of a polymer for forming a resist protection film represented by Formula 7a below (the amount of the repeating unit: mol %, Yield: 62%, weight average molecular weight (Mw): 6845, PDI: 2.45).

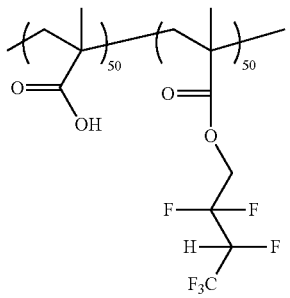

Formula 7a

COMPARATIVE EXAMPLE 2

Preparation of a Polymer for Forming Resist Protection Film Represented by Formula 7b 35.24 g (0.4 mol) of the monomer of the repeating unit represented by Formula 2e, 150.83 g (0.6 mol) of the monomer of the repeating unit represented by Formula 3c, and 27.9 g of the polymerization initiator, AIBN were added to a 1000 mL round-bottom flask and dissolved in a THF solvent. After the reactants were dissolved, the flask was maintained at 70° C. for 12 hours. After the reaction was terminated, a reaction product was precipitated in 4000 mL of hexane, and the precipitate was dried in a vacuum oven at 40° C. for 12 hours. Then, the precipitate was dissolved in ether and re-precipitated in 1000 mL of hexane. The precipitated polymer was collected and dried in a vacuum oven at 40° C. overnight to obtain 129 g of a polymer for forming a resist protection film represented by Formula 7b below (the amount of the repeating unit: mol %, Yield: 69%, weight average molecular weight (Mw): 6977, PDI: 2.65).

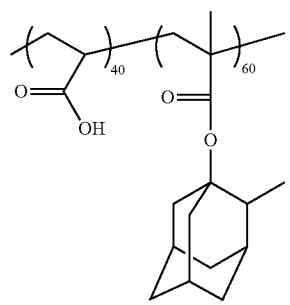

Formula 7b

COMPARATIVE EXAMPLE 3

Preparation of a Polymer for Forming Resist Protection Film Represented by Formula 7c 176.1 g (0.6 mol) of the monomer of the repeating unit represented by Formula 2l, 72.9 g (0.4 mol) of the monomer of the repeating unit represented by Formula 3n, and 37.4 g of the polymerization initiator, AIBN were added to a 1000 mL round-bottom flask and dissolved in a THF solvent. After the reactants were dissolved, the flask was maintained at 70° C. for 12 hours. After the reaction was terminated, a reaction product was precipitated in 4000 mL of hexane, and the precipitate was dried in a vacuum oven at 40° C. for 12 hours. Then, the precipitate was dissolved in ether and re-precipitated in 1000 mL of hexane. The precipitated polymer was collected and dried in a vacuum oven at 40° C. overnight to obtain 175 g of a polymer for forming a resist protection film represented by Formula 7b below (the amount of the repeating unit: mol %, Yield: 70%, weight average molecular weight (Mw): 7001, PDI: 2.73).

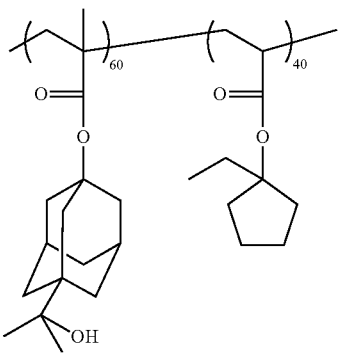

Formula 7c

EXAMPLE 11

Preparation of a Polymer (Blend) for Forming Resist Protection Film 0.204 g of the polymer for forming a resist protection film prepared in Example 2 and 0.816 g of the polymer for forming a resist protection film prepared in Comparative Example 1 were blended at a weight ratio of 2:8 to prepare a polymer (blend) for forming a resist protection film.

EXAMPLE 12

Preparation of a Polymer (Blend) for Forming Resist Protection Film 0.204 g of a homopolymer of the repeating unit represented by Formula 1a (weight average molecular weight (Mw): 8012) and 0.816 g of the polymer for forming a resist protection film prepared in Comparative Example 1 were blended at a weight ratio of 2:8 to prepare a polymer (blend) for forming a resist protection film.

EXAMPLES 13 TO 24 AND COMPARATIVE EXAMPLES 4 TO 6

Preparation and Evaluation of a Resist Protection Film

A photoresist solution (DHA-3606, manufactured by Dongjin Semichem. Co., Ltd.) was coated on a silicon (Si) substrate and baked at 110° C. for 60 seconds to form a resist film (photoresist layer) having a thickness of 150 nm. Each of the compositions for forming a resist protection film prepared by respectively dissolving 3% by weight of the polymers for forming a resist protection film and the blends thereof prepared in Examples 1 to 12 and Comparative Examples 1 to 3 in 97% by weight of 4-methyl-2-pentanol was spin-coated on the resist film and baked at 90° C. for 60 seconds to prepare resist protection films having a thickness of 50 nm.

(i) In order to evaluate contact angles, the receding contact angle, an advancing contact angle, and the sliding contact angle of a wafer on which a resist protection layer is formed were measured using a device that measures contact angles (DSA-100, manufactured by KRUSS) according to a method disclosed in Burnett et al., J. Vac. Sci. Techn. B, 23(6), pages 2721-2727 (November/December 2005).

(ii) In order to reproduce liquid immersion exposure, the change in thickness of a resist protection film before and after deionized water (DIW) (before and after liquid immersion in deionized water) was measured. The wafers (substrates) on which the resist protection films are respectively formed were cleaned with deionized water for 1 minute and the change in the thickness of the resist protection film was observed.

(iii) In order to evaluate leaching of the photoresist composition from the photoresist film, 10 mL of deionized water was placed on a restricted area (3.5 cm$^2$) of each of the wafers (substrates) on which the resist protection film is formed for 60 seconds, and the amount of the leached photoacid generator (PAG) was measured using liquid chromatography/mass spectrometry (LC/MS).

(iv) Refractive index (n) and absorption coefficient (k) of each of the resist protection films were measured at a wavelength of 193 nm using an Ellipsometer (VUV-303, manufactured by J. A Woollam). The results are shown in Table 1 below.

TABLE 1

| | Polymer or blend | Receding contact angle (degrees) | Advancing contact angle (degrees) | Sliding contact angle (degrees) | Film thickness change before and after DI (nm) | PAG (Ma/cm$^2$) | Refractive index (n) | Absorption coefficient (k) |
|---|---|---|---|---|---|---|---|---|
| Example 13 | Example 1 | 83 | 95 | 17 | 0 | $1.45 \times 10^{-13}$ | 1.57 | 0 |
| Example 14 | Example 2 | 80 | 94 | 17 | 0 | $1.48 \times 10^{-13}$ | 1.55 | 0 |
| Example 15 | Example 3 | 77 | 95 | 19 | 0 | $1.47 \times 10^{-13}$ | 1.56 | 0 |
| Example 16 | Example 4 | 82 | 94 | 17 | 0 | $1.47 \times 10^{-13}$ | 1.59 | 0 |
| Example 17 | Example 5 | 83 | 95 | 15 | 0 | $1.49 \times 10^{-13}$ | 1.57 | 0 |
| Example 18 | Example 6 | 78 | 93 | 17 | 0 | $1.49 \times 10^{-13}$ | 1.60 | 0 |
| Example 19 | Example 7 | 78 | 94 | 17 | 0 | $1.49 \times 10^{-13}$ | 1.56 | 0 |
| Example 20 | Example 8 | 80 | 95 | 18 | 0 | $1.49 \times 10^{-13}$ | 1.59 | 0 |
| Example 21 | Example 9 | 79 | 95 | 16 | 0 | $1.48 \times 10^{-13}$ | 1.56 | 0 |
| Example 22 | Example 10 | 76 | 95 | 17 | 0 | $1.44 \times 10^{-13}$ | 1.59 | 0 |
| Example 23 | Example 11 | 84 | 96 | 13 | 0 | $1.42 \times 10^{-13}$ | 1.54 | 0 |
| Example 24 | Example 12 | 85 | 95 | 13 | 0 | $1.41 \times 10^{-13}$ | 1.52 | 0 |
| Comparative Example 4 | Comparative Example 1 | 46 | 87 | 34 | 0 | $1.52 \times 10^{-12}$ | 1.60 | 0 |
| Comparative Example 5 | Comparative Example 2 | 43 | 85 | 37 | 0 | $1.57 \times 10^{-12}$ | 1.62 | 0 |
| Comparative Example 6 | Comparative Example 3 | 49 | 88 | 33 | 0 | $1.49 \times 10^{-12}$ | 1.59 | 0 |

From the data shown in Table 1, it can be clearly seen that the contact angle greatly improves when the liquid immersion lithography process employs the inventive polymer or the blend thereof for forming a resist protection film which comprises the repeating unit represented by Formula 1. In particular, the receding contact angles of the resist protection films prepared according to the present invention (Examples 13 to 24) were in the range of 76 to 84°, which are far higher than those of resist protection films prepared using conventional polymers for the same purpose (Comparative Examples 4 to 6). In addition, the advancing contact angles of the resist protection films prepared according to the present invention increased, and the sliding contact angles of the resist protection films prepared according to the present invention decreased. Thus, it can be seen that a water-repellent property was improved. As the receding contact angle decreases, the water (deionized water etc.) present on the resist protection film becomes less fluid, and thus remains as droplets thus, raising the possibility of defects such as water defects during the liquid immersion exposure process of a high-speed scanning. The use of the inventive polymers and their blends for forming a resist protection film significantly increases the receding contact angle, which leads to more fluidity of water and fewer defects during a liquid immersion exposure of a high-speed scanning.

Furthermore, it has also been demonstrated that the use of the inventive polymers and their blends, reduce the leaching of a photoresist composition (PAG), bring an increase in the receding contact angle and a decrease in the sliding contact angle when compared to conventional resist protection layers. Resist protection films with large absorption coefficients (k) decrease the exposure energy due to light scattering, which in turn, makes it more difficult to produce a photoresist protection film with a uniform pattern. Since the polymers and the blends according to the present invention have an absorption coefficient of 0, photoresist protection films with uniform patterns can be produced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polymer for forming a resist protection film, the polymer being a compound represented by Formula 2 below:

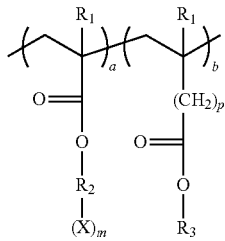

Formula 2 wherein
$R_1$ is a hydrogen atom (H), a fluorine atom (F), a methyl group (—CH$_3$), a C1-C20 fluoroalkyl group, or a C1-C5 hydroxyalkyl group,
$R_2$ is a C1-C10 linear or branched alkylene group or alkylidene group, or a C5-C10 cycloalkylene group or cycloalkylidene group,
X is

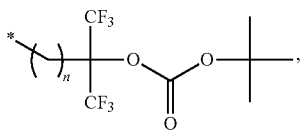

wherein n is an integer of 0 to 5 and * denotes the remaining moiety of Formula 2 after excluding X, and m, the stoichiometric coefficient of X, is 1 or 2,
$R_3$ is a C1-C25 linear or branched alkyl group or a C5-C25 cycloalkyl group comprising at least one hydroxyl group (—OH) or carboxyl group (—COOH), p is an integer of 1 to 3, and a and b are the coefficients of their corresponding repeating units, wherein the amount of the repeating unit denoted by the coefficient a is in the range of 1 to 99% by weight based on the weight of the polymer, and the amount of the repeating unit denoted by the coefficient b is in the range of 1 to 99% by weight based on the weight of the polymer.

2. The polymer for forming a resist protection film of claim 1, wherein the average molecular weight of the polymer represented by Formula 2 is in the range of 1,000 to 100,000.

3. The polymer for forming a resist protection film of claim 1, wherein the polymer represented by Formula 2 comprises one or more structural units selected from the group consisting of structural units represented by Formulae 1a to 1o below:

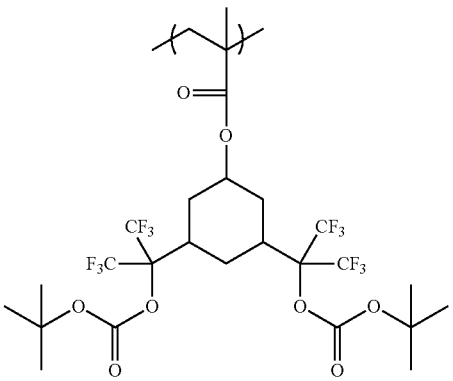

Formula 1a

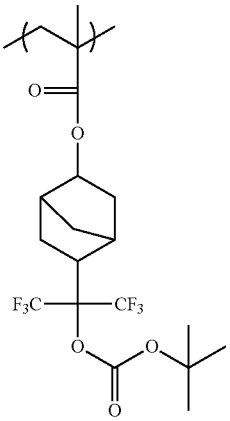

Formula 1b

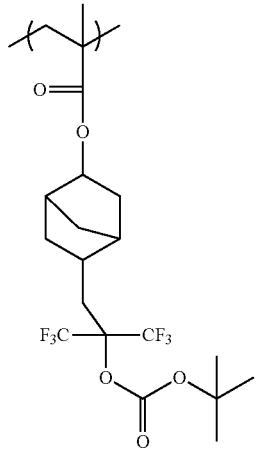

Formula 1c

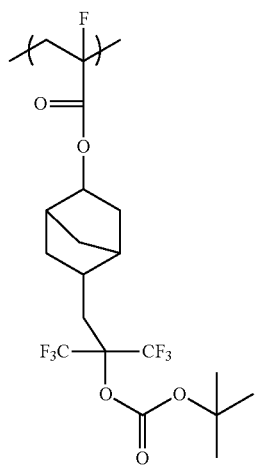
Formula 1d
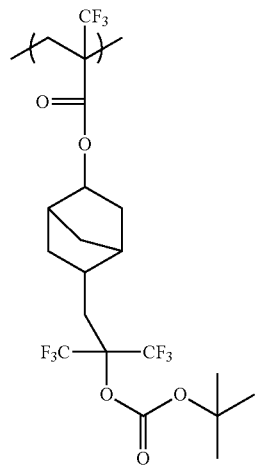
Formula 1g
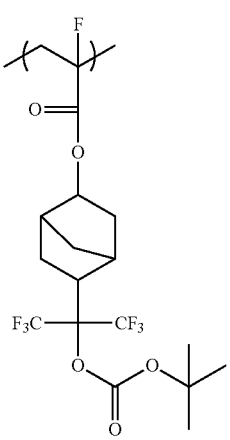
Formula 1e
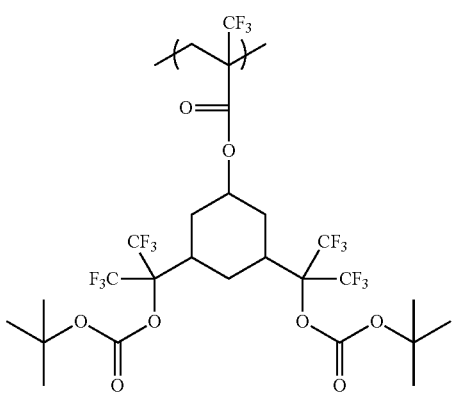
Formula 1h
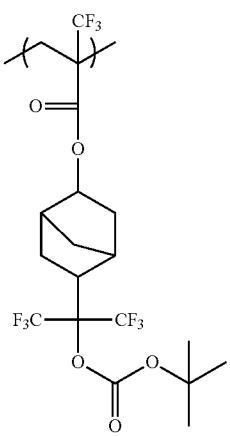
Formula 1f
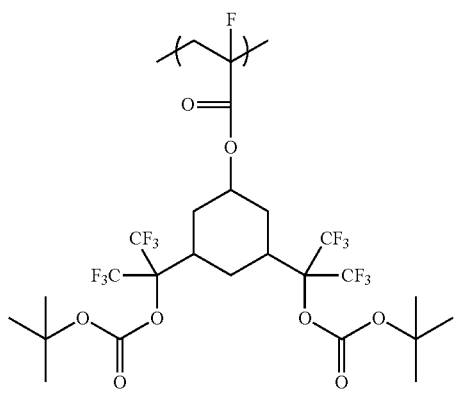
Formula 1i Formula 1j

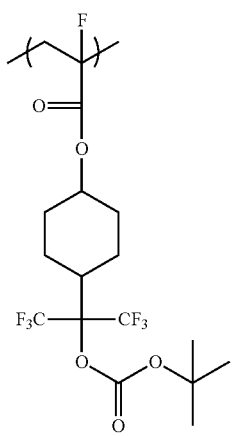

Formula 1k

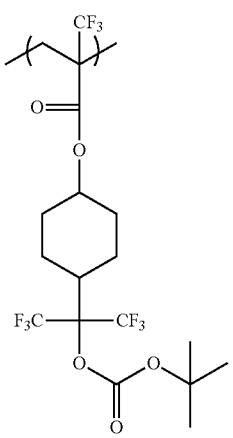

Formula 1l

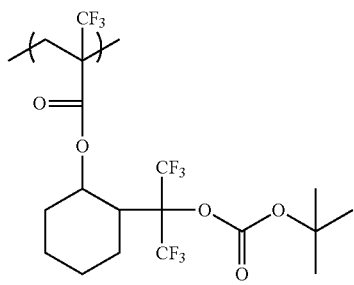

Formula 1m

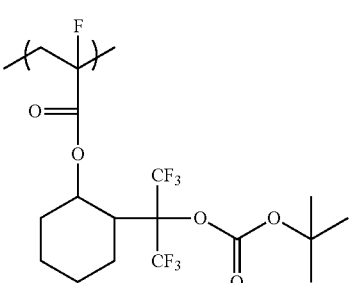

Formula 1n

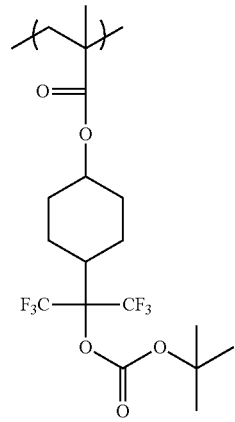

Formula 1o

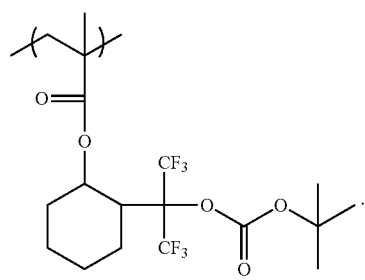

4. A polymer for forming a resist protection film, the polymer being a compound represented by Formula 3 below:

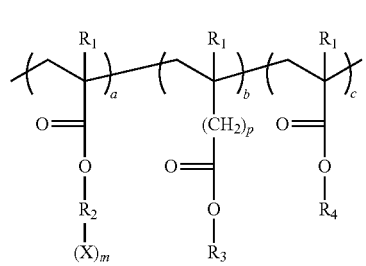

Formula 3 wherein
R₁ is a hydrogen atom (H), a fluorine atom (F), a methyl group (—CH₃), a C1-C20 fluoroalkyl group, or a C1-C5 hydroxyalkyl group,
R₂ is a C1-C10 linear or branched alkylene group or alkylidene group, or a C5-C10 cycloalkylene group or cycloalkylidene group,
X is

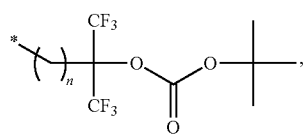

wherein n is an integer of 0 to 5 and * denotes the remaining moiety of Formula 2 after excluding X, and m, the stoichiometric coefficient of X, is 1 or 2,
R₃ is a C1-C25 linear or branched alkyl group or a C5-C25 cycloalkyl group comprising at least one hydroxyl group (—OH) or carboxyl group (—COOH), R₄ is a C1-C25 linear or branched alkyl group or a C5-C25 cycloalkyl group unsubstituted or substituted with at least one fluorine atom, p is an integer of 1 to 3, and a, b, and c are the coefficients of their corresponding repeating units, wherein the amount of the repeating unit denoted by the coefficient a is in the range of 1 to 98% by weight based on the amount of the polymer, the amount of the repeating unit denoted by the coefficient b is in the range of 1 to 98% by weight based on the amount of the polymer, and the amount of the repeating unit denoted by the coefficient c is in the range of 1 to 98% by weight based on the amount of the polymer.

5. The polymer for forming a resist protection film of claim 4, wherein the average molecular weight of the polymer represented by Formula 3 is in the range of 1,000 to 100,000.

6. The polymer for forming a resist protection film of claim 4, wherein the polymer represented by Formula 3 comprises one or more structural units selected from the group consisting of structural units represented by Formulae 1a to 1o below:

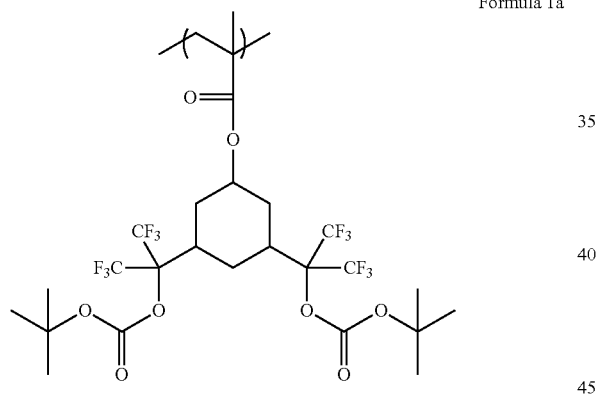

Formula 1a

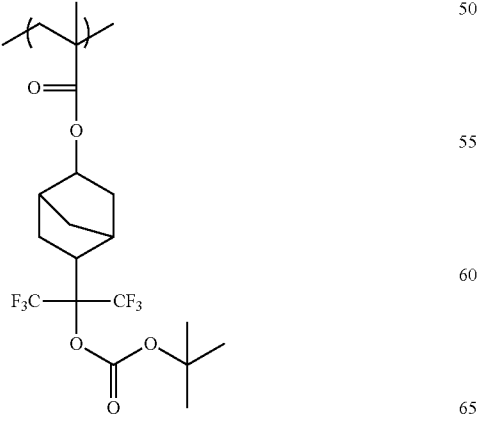

Formula 1b

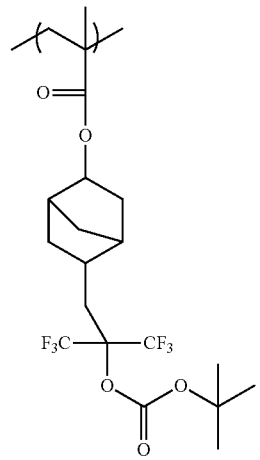

Formula 1c

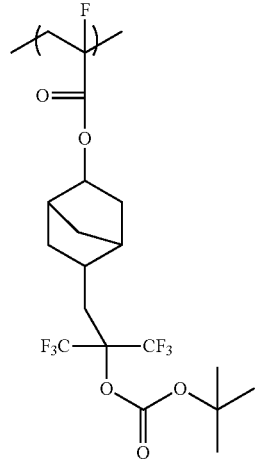

Formula 1d

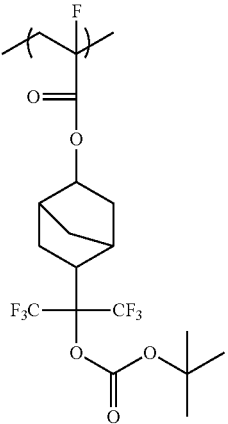

Formula 1e

Formula 1f
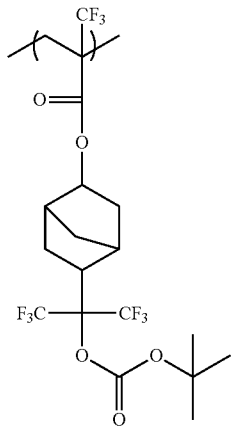
Formula 1g
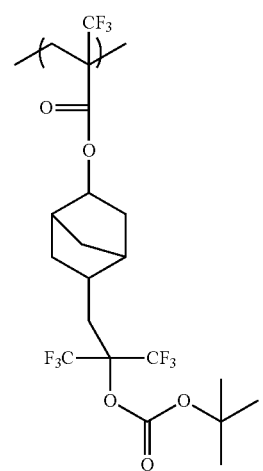
Formula 1h
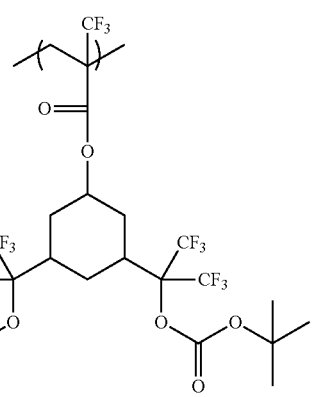
Formula 1i
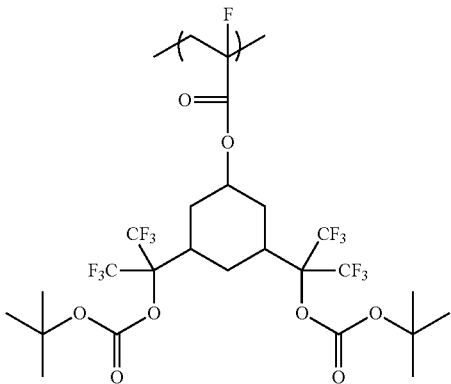
Formula 1j
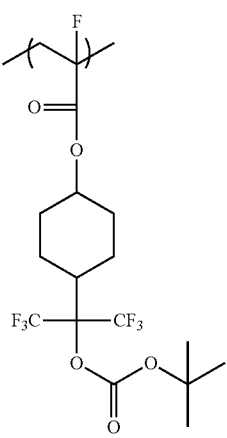
Formula 1k
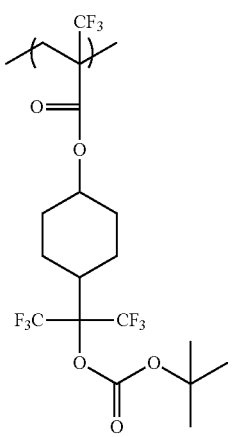
Formula 1l
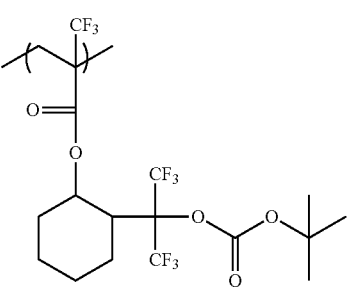

-continued

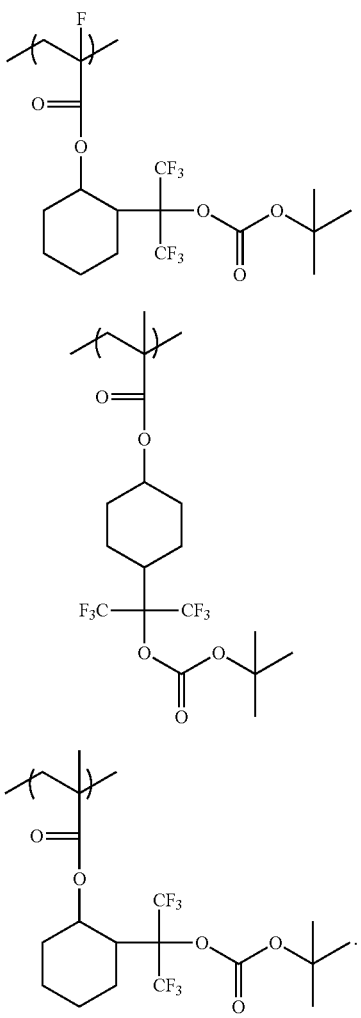

Formula 1m

Formula 1n

Formula 1o

7. A composition for forming a resist protection film comprising:
   1 to 30% by weight of a polymer for forming a resist protection film, the polymer being a compound represented by Formula 2 or 3 below; and
   70 to 99% by weight of a solvent,

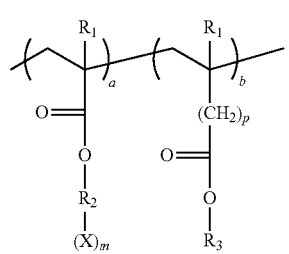

Formula 2 wherein $R_1$ is a hydrogen atom (H), a fluorine atom (F), a methyl group (—$CH_3$), a C1-C20 fluoroalkyl group, or a C1-C5 hydroxyalkyl group, $R_2$ is a C1-C10 linear or branched alkylene group or alkylidene group, or a C5-C10 cycloalkylene group or cycloalkylidene group, X is

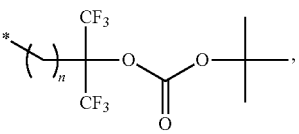

wherein n is an integer of 0 to 5 and * denotes the remaining moiety of Formula 2 after excluding X, and m, the stoichiometric coefficient of X, is 1 or 2, $R_3$ is a C1-C25 linear or branched alkyl group or a C5-C25 cycloalkyl group comprising at least one hydroxyl group (—OH) or carboxyl group (—COOH), p is an integer of 1 to 3, and a and b are the coefficients of their corresponding repeating units, wherein the amount of the repeating unit denoted by the coefficient a is in the range of 1 to 99% by weight based on the weight of the polymer, and the amount of the repeating unit denoted by the coefficient b is in the range of 1 to 99% by weight based on the weight of the polymer,

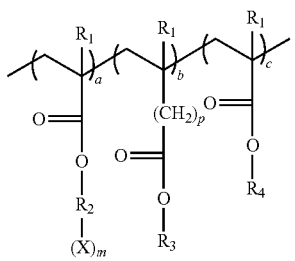

Formula 3 wherein $R_1$, $R_2$, X, and m are as defined above with respect to Formula 2, $R_3$ is a C1-C25 linear or branched alkyl group or a C5-C25 cycloalkyl group comprising at least one hydroxyl group (—OH) or carboxyl group (—COOH), $R_4$ is a C1-C25 linear or branched alkyl group or a C5-C25 cycloalkyl group unsubstituted or substituted with at least one fluorine atom, p is an integer of 1 to 3, and a, b, and c are the coefficients of their corresponding repeating units, wherein the amount of the repeating unit denoted by the coefficient a is in the range of 1 to 98% by weight based on the amount of the polymer, the amount of the repeating unit denoted by the coefficient b is in the range of 1 to 98% by weight based on the amount of the polymer, and the amount of the repeating unit denoted by the coefficient c is in the range of 1 to 98% by weight based on the amount of the polymer.

8. The composition for forming a resist protection film of claim 7, wherein the average molecular weight of the polymer represented by Formula 2 or 3 is in the range of 1,000 to 100,000.

9. The composition for forming a resist protection film of claim 7, wherein the polymer represented by Formula 2 or 3 comprises one or more structural units selected from the group consisting of structural units represented by Formulae 1a to 1o below:

Formula 1a
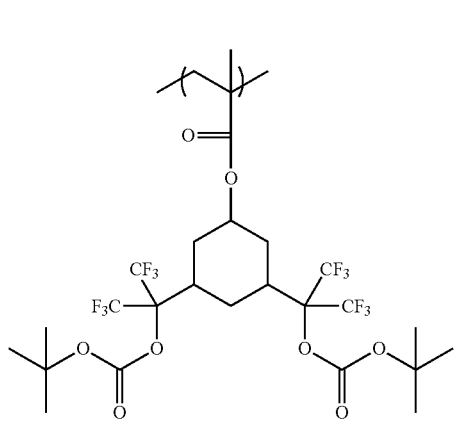
Formula 1b
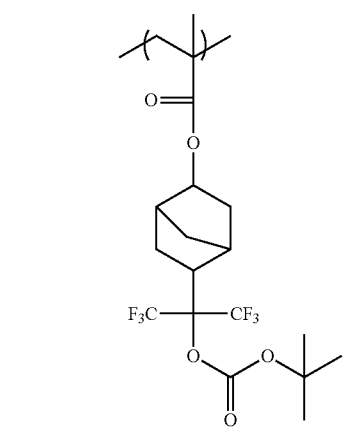
Formula 1c
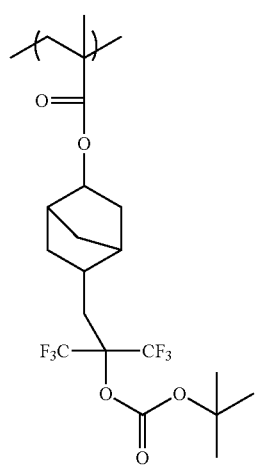
Formula 1d
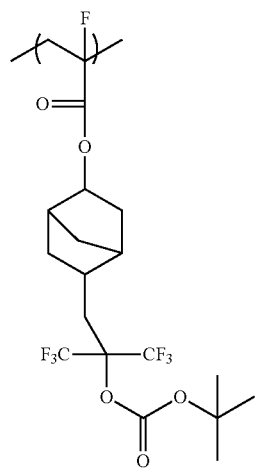
Formula 1e
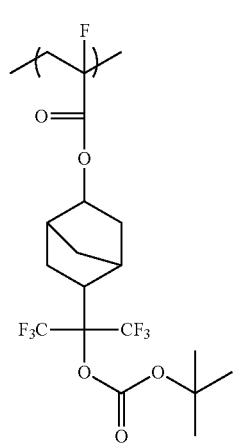
Formula 1f
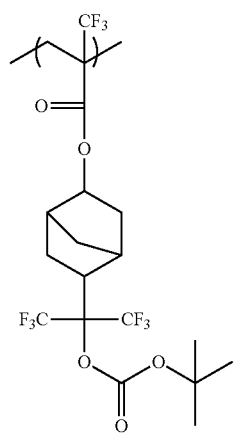

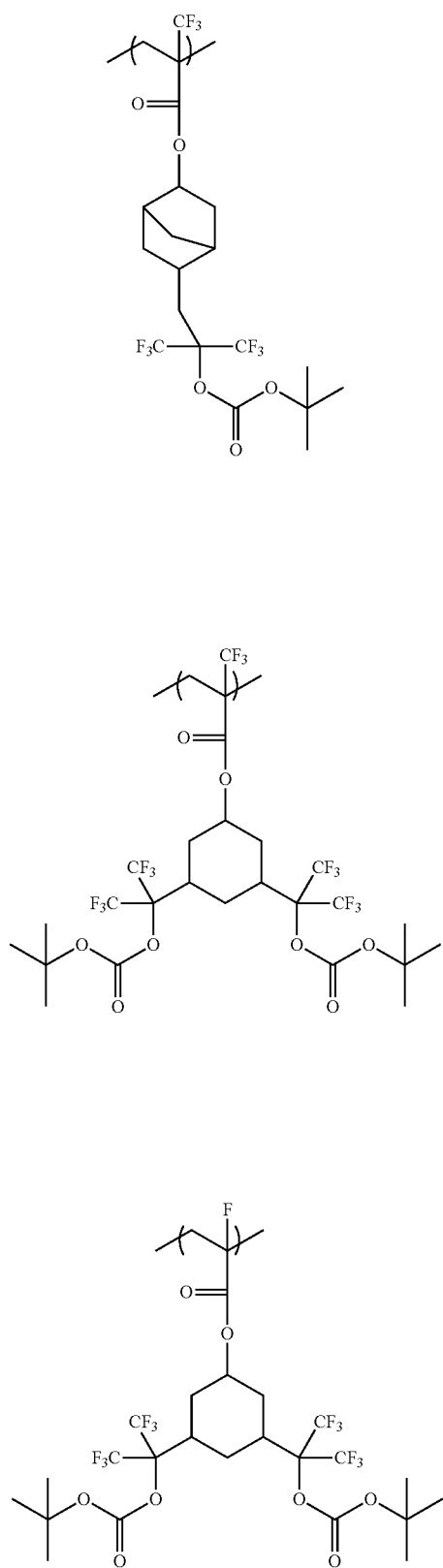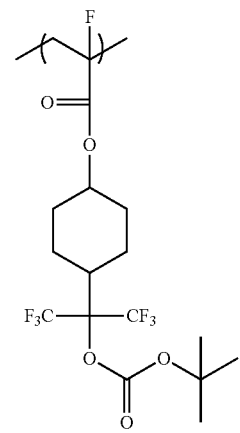

-continued

Formula 1n

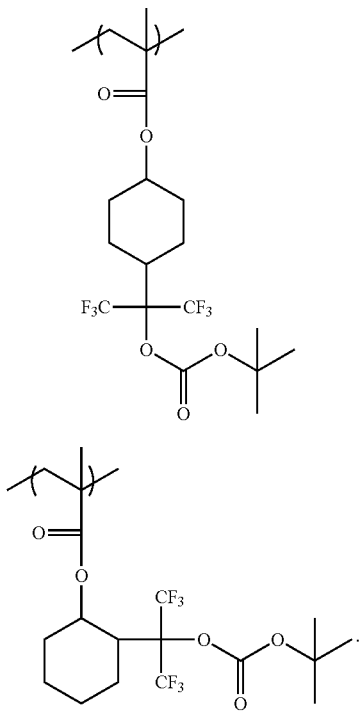

Formula 1o

10. A method of forming a pattern of a semiconductor device, the method comprising:
    coating a composition for forming a resist protection film comprising 1 to 30% by weight of a polymer for forming a resist protection film, the polymer being a compound represented by Formula 2 or 3 below and 70 to 99% by weight of a solvent, upon a photoresist layer formed on top of the layer to be etched;
    forming a resist protection film by baking the coated composition;
    exposing by liquid immersion the photoresist layer on which the resist protection film is formed, and post-baking the exposed photoresist layer;
    forming a photoresist pattern by developing the post-baked photoresist layer with a developing solution; and
    forming a pattern by etching the layer to be etched using the photoresist pattern as an etch mask, Formula 2

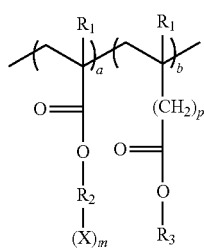

wherein $R_1$ is a hydrogen atom (H), a fluorine atom (F), a methyl group (—$CH_3$), a C1-C20 fluoroalkyl group, or a C1-C5 hydroxyalkyl group, $R_2$ is a C1-C10 linear or branched alkylene group or alkylidene group, or a C5-C10 cycloalkylene group or cycloalkylidene group, X is

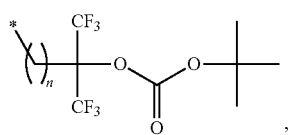

wherein n is an integer of 0 to 5 and * denotes the remaining moiety of Formula 2 after excluding X, and m, the stoichiometric coefficient of X, is 1 or 2, $R_3$ is a C1-C25 linear or branched alkyl group or a C5-C25 cycloalkyl group comprising at least one hydroxyl group (—OH) or carboxyl group (—COOH), p is an integer of 1 to 3, and a and b are the coefficients of their corresponding repeating units, wherein the amount of the repeating unit denoted by the coefficient a is in the range of 1 to 99% by weight based on the weight of the polymer, and the amount of the repeating unit denoted by the coefficient b is in the range of 1 to 99% by weight based on the weight of the polymer, Formula 3

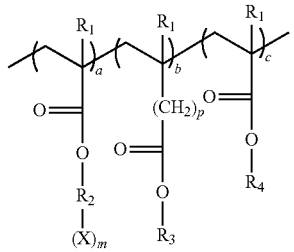

wherein $R_1$, $R_2$, X, and m are as defined above with respect to Formula 2, $R_3$ is a C1-C25 linear or branched alkyl group or a C5-C25 cycloalkyl group comprising at least one hydroxyl group (—OH) or carboxyl group (—COOH), $R_4$ is a C1-C25 linear or branched alkyl group or a C5-C25 cycloalkyl group unsubstituted or substituted with at least one fluorine atom, p is an integer of 1 to 3, and a, b, and c are the coefficients of their corresponding repeating units, wherein the amount of the repeating unit denoted by the coefficient a is in the range of 1 to 98% by weight based on the amount of the polymer, the amount of the repeating unit denoted by the coefficient b is in the range of 1 to 98% by weight based on the amount of the polymer, and the amount of the repeating unit denoted by the coefficient c is in the range of 1 to 98% by weight based on the amount of the polymer.

11. The method of forming a pattern of a semiconductor device of claim 10, wherein the average molecular weight of the polymer represented by Formula 2 or 3 is in the range of 1,000 to 100,000.

12. The method of forming a pattern of a semiconductor device of claim 10, wherein the polymer represented by Formula 2 or 3 comprises one or more structural units selected from the group consisting of structural units represented by Formulae 1a to 1o below:

Formula 1a
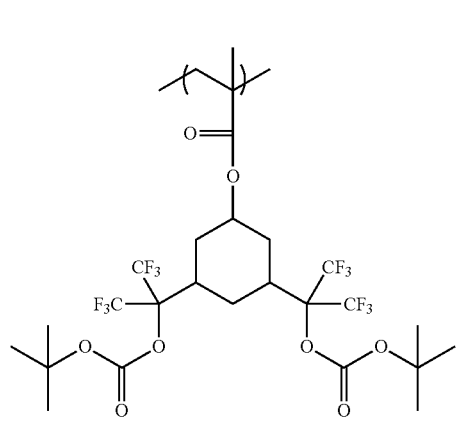
Formula 1b
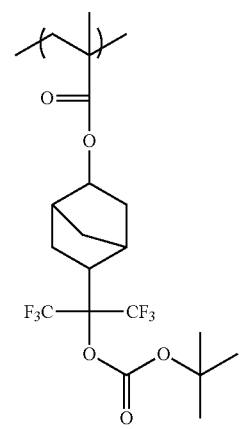
Formula 1c
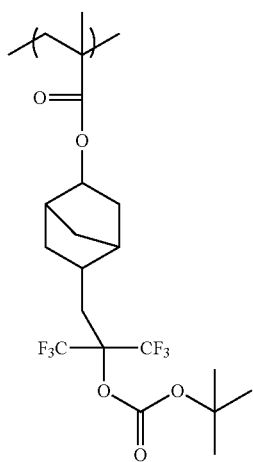
Formula 1d
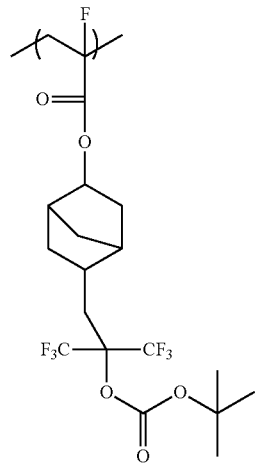
Formula 1e
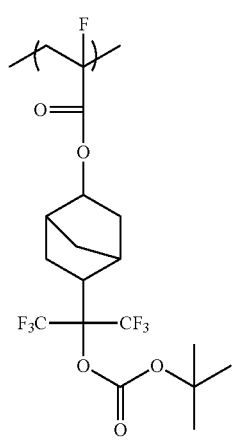
Formula 1f
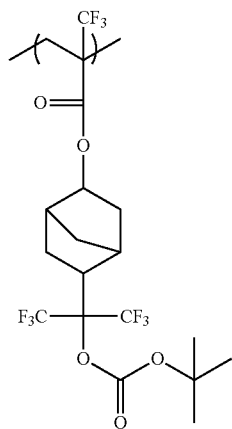

Formula 1g
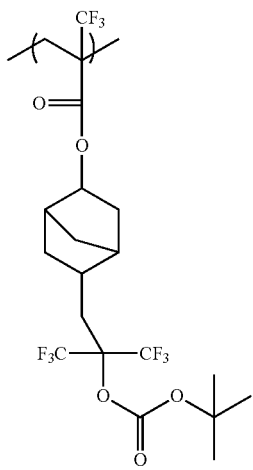
Formula 1h
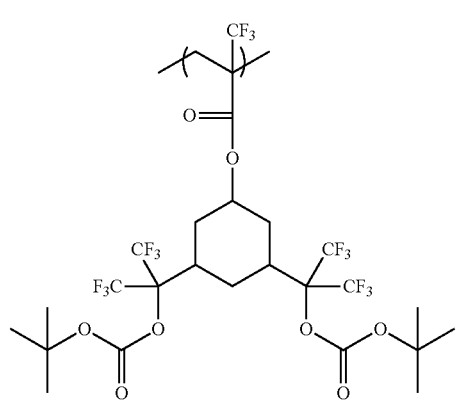
Formula 1i
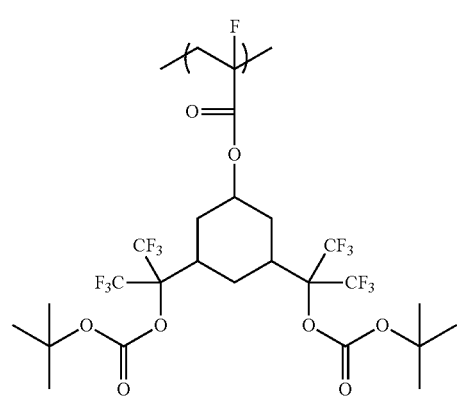
Formula 1j
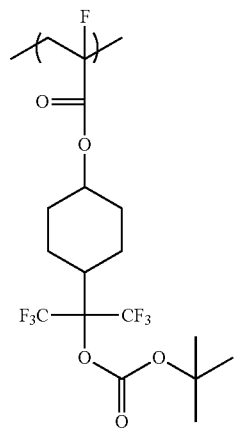
Formula 1k
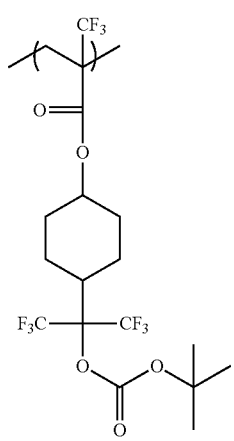
Formula 1l
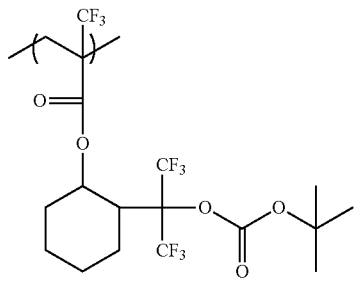
Formula 1m
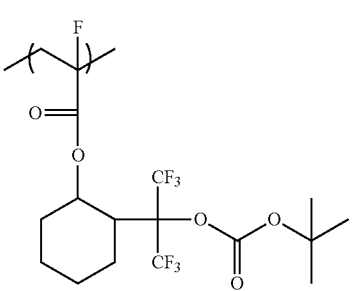

Formula 1n
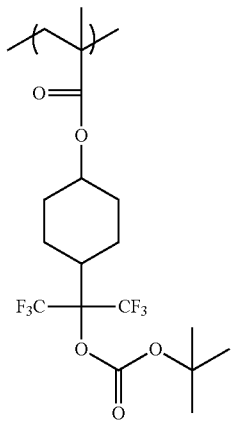
Formula 1o
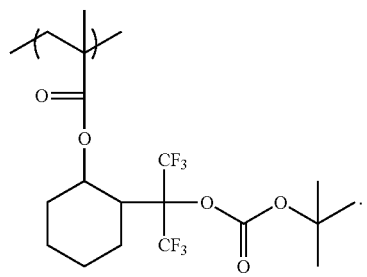
* * * * *